United States Patent
Mori et al.

(10) Patent No.: US 12,191,168 B2
(45) Date of Patent: Jan. 7, 2025

(54) LASER PROCESSING DEVICE, LASER PROCESSING SYSTEM AND LASER PROCESSING METHOD

(71) Applicant: Tokyo Electron Limited, Tokyo (JP)

(72) Inventors: Hirotoshi Mori, Koshi (JP); Yoshihiro Kawaguchi, Koshi (JP); Hayato Tanoue, Koshi (JP); Kazuya Hisano, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1079 days.

(21) Appl. No.: 16/979,191

(22) PCT Filed: Mar. 27, 2019

(86) PCT No.: PCT/JP2019/013292
§ 371 (c)(1),
(2) Date: Sep. 9, 2020

(87) PCT Pub. No.: WO2019/198512
PCT Pub. Date: Oct. 17, 2019

(65) Prior Publication Data
US 2020/0411338 A1    Dec. 31, 2020

(30) Foreign Application Priority Data
Apr. 9, 2018    (JP) ................... 2018-074994

(51) Int. Cl.
*H01L 21/67* (2006.01)
*B23K 26/00* (2014.01)
(Continued)

(52) U.S. Cl.
CPC .... *H01L 21/67092* (2013.01); *B23K 26/0006* (2013.01); *B23K 26/032* (2013.01);
(Continued)

(58) Field of Classification Search
CPC ............. H01L 21/67092; H01L 21/268; H01L 21/67115; H01L 21/78; H01L 23/544;
(Continued)

(56) References Cited

U.S. PATENT DOCUMENTS

2007/0084837 A1* 4/2007 Kosmowski ....... B23K 26/0853
219/121.68
2008/0035851 A1* 2/2008 Takeishi ................ G21K 5/10
257/E23.179
(Continued)

FOREIGN PATENT DOCUMENTS

CN         107042433 A  * 8/2017  ............. B08B 3/02
DE    202009014893 U1 * 6/2011  ........... B23K 26/048
(Continued)

OTHER PUBLICATIONS

International Search Report of PCT/JP2019/013292 dated Jun. 18, 2019.

*Primary Examiner* — Helena Kosanovic
*Assistant Examiner* — Damon Joel David Alfaro
(74) *Attorney, Agent, or Firm* — Shih IP Law Group, PLLC.

(57) ABSTRACT

A laser processing device includes a height measurement unit configured to measure a vertical direction position of an irradiation point of a processing laser beam on an upper surface of a substrate; and a controller configured to control a vertical direction position of a light condensing unit based on the vertical direction position of the irradiation point while moving the irradiation point along multiple dividing target lines. The height measurement unit includes a coaxial laser displacement meter and a separate-axis laser displacement meter. The controller controls the vertical direction position of the light condensing unit by using only one of the coaxial or the separate-axis laser displacement meter for each of the multiple dividing target lines while the substrate (Continued)

is processed and performs a switchover of a laser displacement meter for controlling the vertical direction position of the light condensing unit between the coaxial and the separate-axis laser displacement meters.

7 Claims, 16 Drawing Sheets

(51) Int. Cl.
| | |
|---|---|
| *B23K 26/03* | (2006.01) |
| *B23K 26/046* | (2014.01) |
| *B23K 26/06* | (2014.01) |
| *B23K 26/082* | (2014.01) |
| *B23K 26/53* | (2014.01) |
| *G01B 11/06* | (2006.01) |
| *H01L 21/268* | (2006.01) |
| *H01L 21/78* | (2006.01) |
| *H01L 23/544* | (2006.01) |

(52) U.S. Cl.
CPC ........ *B23K 26/046* (2013.01); *B23K 26/0665* (2013.01); *B23K 26/082* (2015.10); *B23K 26/53* (2015.10); *G01B 11/0608* (2013.01); *G01B 11/0625* (2013.01); *H01L 21/268* (2013.01); *H01L 21/67115* (2013.01); *H01L 21/78* (2013.01); *H01L 23/544* (2013.01); *H01L 2223/5446* (2013.01)

(58) Field of Classification Search
CPC ... H01L 2223/5446; H01L 2221/68327; H01L 2221/6834; H01L 2221/68381; H01L 21/6836; B23K 26/0006; B23K 26/032; B23K 26/046; B23K 26/0665; B23K 26/082; B23K 26/53; B23K 26/048; B23K 26/03; B23K 26/364; G01B 11/0608; G01B 11/0625; G01B 11/00
See application file for complete search history.

(56) References Cited

U.S. PATENT DOCUMENTS

| | | | |
|---|---|---|---|
| 2008/0050677 A1* | 2/2008 | Takeishi | B23K 26/066 430/311 |
| 2009/0039275 A1* | 2/2009 | Takeishi | B23K 26/364 250/370.08 |
| 2009/0277889 A1* | 11/2009 | Kobayashi | B23K 26/53 219/121.78 |
| 2013/0122619 A1* | 5/2013 | Aikawa | H01L 33/0095 438/33 |
| 2013/0218337 A1* | 8/2013 | Minami | B25J 9/1682 700/248 |
| 2017/0320165 A1* | 11/2017 | Hyakumura | B23K 26/046 |
| 2019/0009361 A1* | 1/2019 | Xu | B23K 26/048 |
| 2020/0038954 A1* | 2/2020 | Regulin | B23K 26/147 |
| 2020/0298345 A1* | 9/2020 | Okuma | B23K 26/083 |

FOREIGN PATENT DOCUMENTS

| | | | | |
|---|---|---|---|---|
| DE | 102015015651 B3 * | 4/2017 | | B23K 26/03 |
| JP | 2009-269074 A | 11/2009 | | |
| JP | 2012059907 A * | 3/2012 | | |
| JP | 2014233731 A * | 12/2014 | | B23K 26/03 |
| KR | 101279578 B1 * | 6/2013 | | |
| KR | 20140071528 A * | 6/2014 | | |
| KR | 20180015353 A * | 2/2018 | | |
| WO | WO-2004105110 A1 * | 12/2004 | | B23K 26/04 |
| WO | WO-2013038606 A1 * | 3/2013 | | B23K 26/032 |
| WO | WO-2017130914 A1 * | 8/2017 | | B23K 26/0006 |
| WO | WO-2017130953 A1 * | 8/2017 | | B23K 26/032 |
| WO | WO-2017145610 A1 * | 8/2017 | | B23K 26/00 |
| WO | WO-2017170553 A1 * | 10/2017 | | B23K 26/00 |

* cited by examiner

LASER PROCESSING DEVICE, LASER PROCESSING SYSTEM AND LASER PROCESSING METHOD

TECHNICAL FIELD

The various aspects and embodiments described herein pertain generally to a laser processing device, a laser processing system and a laser processing method.

BACKGROUND

A main surface of a substrate, such as a semiconductor wafer, is partitioned into a plurality of streets formed in a lattice shape, and in each of the divided regions, elements, circuits, terminals, and the like are formed in advance. Chips can be obtained by dividing the substrate along the plurality of streets formed in the lattice shape. The substrate may be divided by using, for example, a laser processing device.

A laser processing device disclosed in Patent Document 1 includes a condensing point position adjusting device for displacing a condensing point position of a processing laser beam for processing a substrate, a height position detecting device for detecting a height position of an upper surface of the substrate and a control device for controlling the condensing point position adjusting device based on a detection signal from the height position detecting device. Accordingly, the laser processing device can form a modification layer uniformly to a predetermined depth from the upper surface of the substrate.

The height position detecting device described in Patent Document 1 includes a laser displacement meter for measuring the height of the upper surface of the substrate by radiating a measurement laser beam to the upper surface of the substrate and receiving a reflected light thereof. The measurement laser beam has a different wavelength from the processing laser beam and has the same path as the processing laser beam from a dichroic mirror provided in a path of the processing laser beam to the upper surface of the substrate.

The dichroic mirror allows a laser beam having a specific wavelength (for example, processing laser beam) to be transmitted therethrough and reflects a laser beam having another specific wavelength (for example, measurement laser beam). Thus, it is possible to simultaneously radiate the processing laser beam and the measurement laser beam to a point on the upper surface of the substrate.

PRIOR ART DOCUMENT

Patent Document 1: Japanese Patent Laid-open Publication No. 2009-269074

DISCLOSURE OF THE INVENTION

Means for Solving the Problems

In one exemplary embodiment, a laser processing device includes: a substrate holder configured to horizontally hold a substrate from below; a processing laser oscillator configured to oscillate a processing laser beam for processing the substrate; an irradiation point moving unit configured to move an irradiation point of the processing laser beam on an upper surface of the substrate held on the substrate holder; a height measurement unit configured to measure a vertical direction position of the irradiation point; a light condensing unit configured to condense the processing laser beam from above to below the irradiation point; a light condensing unit moving unit configured to vertically moves the light condensing unit; and a controller configured to control a vertical direction position of the light condensing unit based on the vertical direction position of the irradiation point while moving the irradiation point along multiple dividing target lines on the upper surface of the substrate. The height measurement unit includes: a coaxial laser displacement meter configured to measure the vertical direction position of the irradiation point by radiating, to the upper surface of the substrate, a first measurement laser beam having a different wavelength from the processing laser beam and a path same as the processing laser beam from a dichroic mirror provided in a path of the processing laser beam to the upper surface of the substrate and by receiving a reflected light of the first measurement laser beam; and a separate-axis laser displacement meter configured to measure the vertical direction position of the irradiation point by radiating, to the upper surface of the substrate, a second measurement laser beam having a different wavelength and a different path from the processing laser beam and the first measurement laser beam and by receiving a reflected light of the second measurement laser beam. Further, the controller controls the vertical direction position of the light condensing unit by using only any one of the coaxial laser displacement meter or the separate-axis laser displacement meter for each of the multiple dividing target lines while the substrate is processed with the processing laser beam and performs a switchover of a laser displacement meter for controlling the vertical direction position of the light condensing unit between the coaxial laser displacement meter and the separate-axis laser displacement meter.

DETAILED DESCRIPTION

Figure 1:
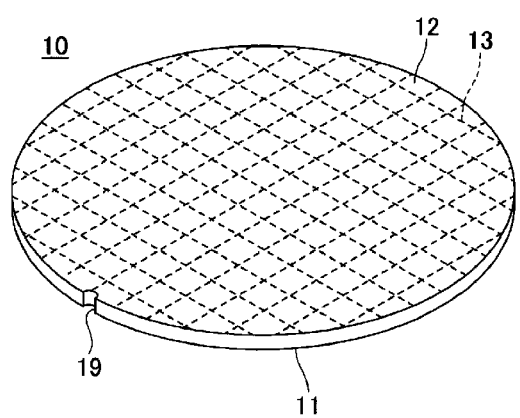
FIG. 1 is a perspective view illustrating a substrate which has not been processed by a substrate processing system according to a first exemplary embodiment.

Hereinafter, exemplary embodiments of the present disclosure will be described with reference to the accompanying drawings. In the drawings, same or corresponding parts will be assigned same or corresponding reference numerals, and redundant description may be omitted. In the following description, the X-axis direction, the Y-axis direction and the Z-axis direction are orthogonal to each other. The X-axis direction and the Y-axis direction are horizontal directions, and the Z-axis direction is a vertical direction. A rotation direction around a vertical axis is also referred to as θ direction. In the present exemplary embodiments, the X axis corresponds to a first axis described in the claims, the Y-axis direction corresponds to a second axis described in the claims, and the Z-axis corresponds to a third axis described in the claims. In the present specification, the term "downward" refers to "downward in the vertical direction", and the term "upward" refers to "upward in the vertical direction".

FIG. 1 is a perspective view illustrating a substrate which has not been processed by a substrate processing system according to a first exemplary embodiment. A substrate 10 is, for example, a semiconductor substrate, a sapphire substrate, or the like. A first main surface 11 of the substrate 10 is partitioned into a plurality of streets formed in a lattice shape, and in each of the divided regions, elements, circuits, ports, and the like are formed in advance. Chips can be obtained by dividing the substrate 10 along the plurality of streets formed in the lattice shape. Dividing target lines 13 are set on the streets.

A protective tape 14 (see FIG. 6) is attached to the first main surface 11 of the substrate 10. While a laser processing is performed, the protective tape 14 protects the first main surface 11 of the substrate 10 to protect the devices formed in advance on the first main surface 11. The protective tape 14 entirely covers the first main surface 11 of the substrate 10.

The protective tape 14 is formed of a sheet member and an adhesive coated on the surface of the sheet member. By irradiating the adhesive with UV, the adhesive may be cured and the adhesive strength thereof may be decreased. After the decrease in the adhesive strength, the protective tape 14 can be easily peeled off from the substrate 10.

Further, the protective tape 14 may be provided on a ring-shaped frame so as to cover an opening of the frame and bonded to the substrate 10 at the opening of the frame. In this case, the substrate 10 can be transferred while being held on the frame. Thus, the handling property of the substrate 10 can be improved.

Figure 2:
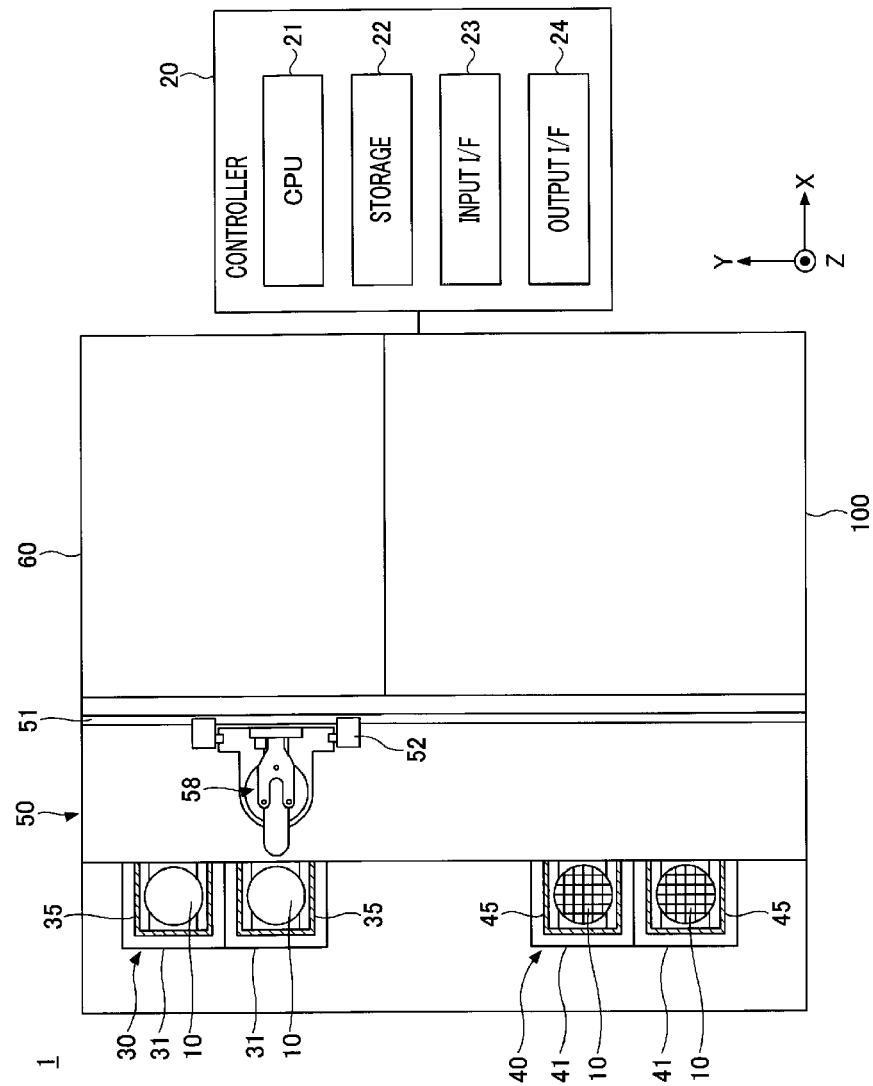
FIG. 2 is a plan view illustrating the substrate processing system according to the first exemplary embodiment.

FIG. 2 is a plan view illustrating the substrate processing system according to the first exemplary embodiment. FIG. 2 is a cutaway view of a carry-in cassette 35 and a carry-out cassette 45 and illustrates the inside of the carry-in cassette 35 and the inside of the carry-out cassette 45.

A substrate processing system 1 is a laser processing system configured to perform a laser processing on the substrate 10. The substrate processing system 1 includes a controller 20, a carry-in unit 30, a carry-out unit 40, a transfer path 50, a transfer unit 58 and various processing units. The processing units are not particularly limited and may include, for example, an alignment unit 60 and a laser processing unit 100. Further, in the present exemplary embodiment, the laser processing unit 100 corresponds to a laser processing device described in the claims.

Further, in the present exemplary embodiment, the transfer unit 58 corresponds to a transfer device described in the claims, the alignment unit 60 corresponds to an alignment device described in the claims, and the laser processing unit 100 corresponds to a laser processing device described in the claims.

The controller 20 is configured as, for example, a computer and has a central processing unit (CPU) 21, a storage 22 such as a memory, an input interface 23 and an output interface 24 as illustrated in FIG. 2. The controller 20 is configured to perform various controls when the CPU 21 executes a program stored in the storage 22. Also, the controller 20 receives a signal from the outside through the input interface 23 and transmits a signal to the outside through the output interface 24.

A program of the controller 20 is stored in a data storage, and is installed from the data storage. Examples of the data storage may include a hard disk (HD), a flexible disk (FD), a compact disk (CD), a magneto-optical disc (MO) or a memory card. Further, the program may be installed by being downloaded from a server through the Internet.

The carry-in cassette 35 is carried into the carry-in unit 30 from the outside. The carry-in unit 30 is equipped with a placing plate 31 on which the carry-in cassette 35 is placed. A plurality of placing plates 31 is provided in a row along the Y-axis direction. The number of placing plates 31 is not limited to the illustrated embodiment. The carry-in cassette 35 accommodates a plurality of substrates 10, which has not been processed, at an interval along the Z-axis direction.

The carry-in cassette 35 may horizontally accommodate the substrate 10 with the protective tape 14 facing upward to suppress deformation, such as peeling-off, of the protective tape 14. The substrate 10 taken out of the carry-in cassette 35 is inverted and then transferred to the processing unit such as the alignment unit 60.

The carry-out cassette 45 is carried out of the carry-out unit 40 to the outside. The carry-out unit 40 is equipped with a placing plate 41 on which the carry-out cassette 45 is placed. A plurality of placing plates 41 is provided in a row along the Y-axis direction. The number of placing plates 41 is not limited to the illustrated embodiment. The carry-out cassette 45 accommodates a plurality of substrates 10, which has been processed, at an interval along the Z-axis direction.

The transfer path 50 is a passage through which the transfer unit 58 transfers the substrate 10, and is extended, for example, in the Y-axis direction. The transfer path 50 is equipped with a Y-axis guide 51 extended in the Y-axis direction, and a Y-axis slider 52 is movable along the Y-axis guide 51.

The transfer unit 58 is configured to hold the substrate 10 and also moves along the transfer path 50 to transfer the substrate 10. The transfer unit 58 may hold the substrate 10 via the frame. The transfer unit 58 is configured to vacuum-attract the substrate 10, but may electrostatically attract the substrate 10. The transfer unit 58 includes the Y-axis slider 52 serving as a transfer base body and moves in the Y-axis direction. The transfer unit 58 can also move in the X-axis direction, the Z-axis direction and the θ direction as well as the Y-axis direction. The transfer unit 58 also includes an inverting mechanism configured to invert the substrate 10.

The transfer unit 58 may include a plurality of holders configured to hold the substrate 10. The plurality of holders may be provided at an interval along the Z-axis direction. The plurality of holders may be separately used for each processing on the substrate 10.

The carry-in unit 30, the carry-out unit 40, the alignment unit 60 and the laser processing unit 100 are provided adjacent to the transfer path 50 when viewed from the vertical direction. For example, a longitudinal direction of the transfer path 50 is the Y-axis direction. On the negative X-axis direction side of the transfer path 50, the carry-in unit 30 and the carry-out unit 40 are provided. Also, on the positive X-axis direction side of the transfer path 50, the alignment unit 60 and the laser processing unit 100 are provided.

Further, the placement and number of processing units such as the alignment unit 60 and the laser processing unit 100 are not limited to the embodiment illustrated in FIG. 2 and can be selected as required. Also, a plurality of processing units may be distributed and integrated in any unit. Hereinafter, each processing unit will be described.

The alignment unit 60 is configured to measure a center position of the substrate 10 and a crystal orientation of the substrate 10 (for example, a direction of a notch 19). For example, the alignment unit 60 includes a substrate holder configured to hold the substrate 10 from below, an imaging unit configured to image the substrate 10 held on the substrate holder and a moving unit configured to move an imaging position where the substrate 10 is imaged by the imaging unit. Also, the crystal orientation of the substrate 10 may be indicated by an orientation flat instead of the notch 19.

The laser processing unit 100 is configured to perform a laser processing on the substrate 10. For example, the laser processing unit 100 performs a laser processing (so-called laser dicing) of dividing the substrate 10 into a plurality of chips. The laser processing unit 100 performs the laser processing on the substrate 10 by irradiating, with a processing laser beam LB1 (see FIG. 6), an irradiation point on a dividing target line 13 (see FIG. 1) and by moving the irradiation point on the dividing target line 13.

Figure 3:
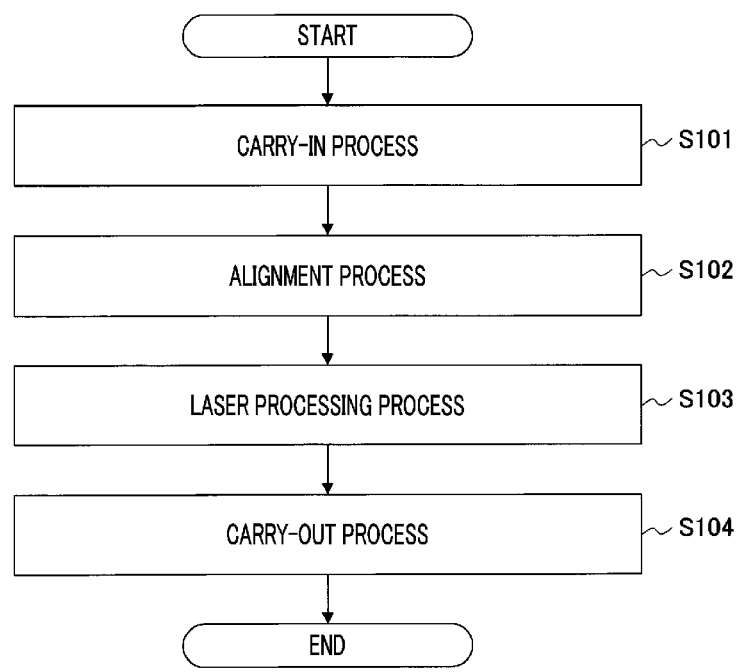
FIG. 3 is a flowchart showing a substrate processing method according to the first exemplary embodiment.

Hereinafter, a substrate processing method using the substrate processing system 1 having the above-described configuration will be described with reference to FIG. 3. FIG. 3 is a flowchart showing a substrate processing method according to the first exemplary embodiment.

As illustrated in FIG. 3, the substrate processing method includes a carry-in process S101, an alignment process S102, a laser processing process S103 and a carry-out process S104. These processes are performed under the control of the controller 20.

In the carry-in process S101, the transfer unit 58 takes the substrate 10 out of the carry-in cassette 35 placed on the carry-in unit 30 and inverts the taken substrate 10, and then, transfers the substrate 10 to the alignment unit 60.

In the alignment process S102, the alignment unit 60 measures the center position of the substrate 10 and the crystal orientation of the substrate 10 (for example, the direction of the notch 19). The positions of the substrate 10 in the X-axis direction, the Y-axis direction and the θ direction can be adjusted based on the result of the measurement. The substrate 10 whose position has been adjusted is transferred from the alignment unit 60 to the laser processing unit 100 by the transfer unit 58.

In the laser processing process S103, the laser processing unit 100 performs the laser processing on the substrate 10. The laser processing unit 100 performs the laser processing of dividing the substrate 10 into the chips by irradiating, with the processing laser beam LB1 (see FIG. 6), an irradiation point on a dividing target line 13 (see FIG. 1) and by moving the irradiation point on the dividing target line 13.

In the carry-out process S104, the transfer unit 58 transfers the substrate 10 from the laser processing unit 100 to the carry-out unit 40, and then, accommodates the substrate 10 within the carry-out cassette 45 on the carry-out unit 40. The carry-out cassette 45 is carried out of the carry-out unit 40 to the outside.

Figure 4A:
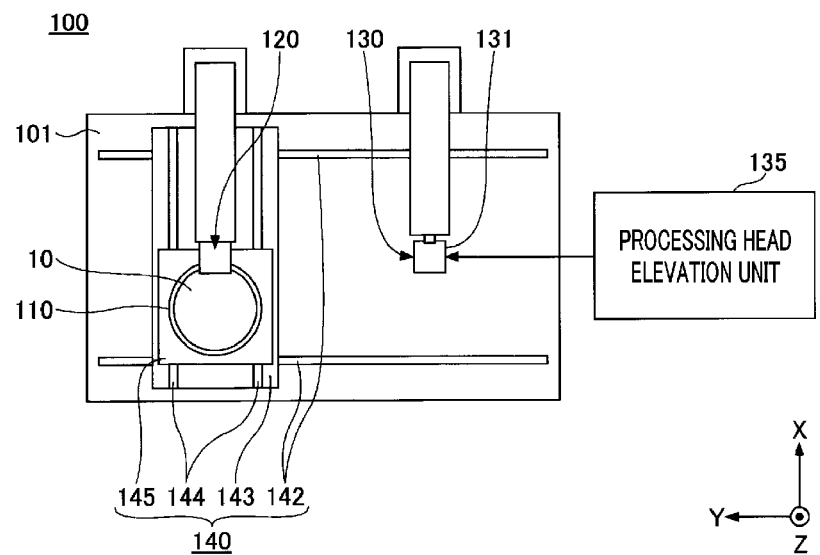
FIG. 4A and FIG. 4B show plan views illustrating a laser processing unit according to the first exemplary embodiment.
Figure 4B:
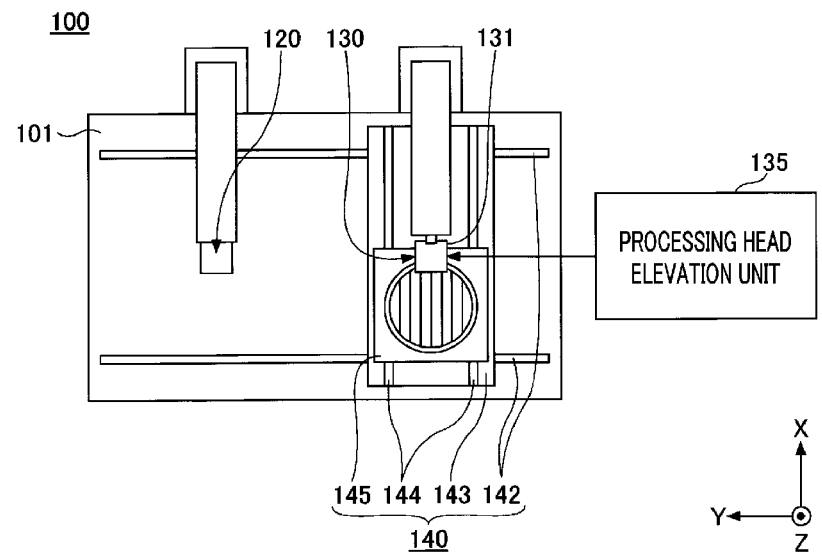
Figure 5:
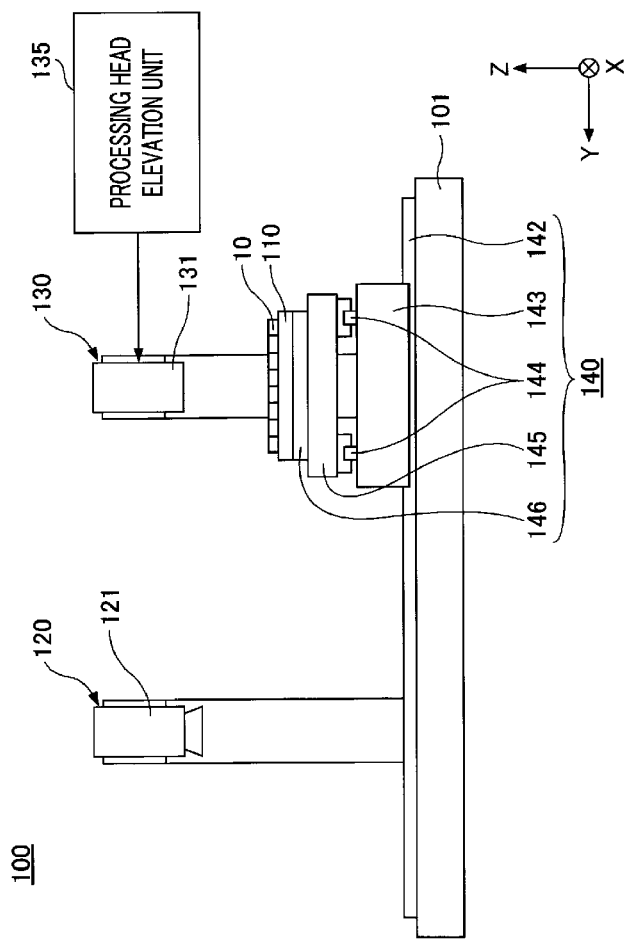
FIG. 5 is a front view illustrating the laser processing unit according to the first exemplary embodiment.
Figure 6:
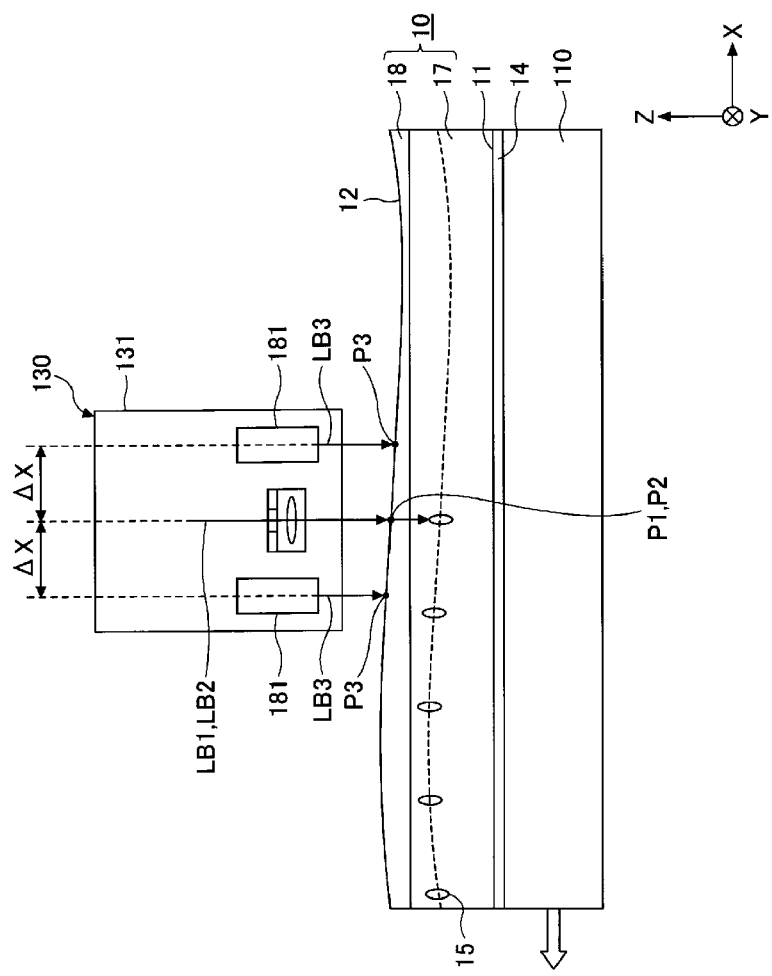
FIG. 6 is a side view illustrating a processing head unit and a substrate holder according to the first exemplary embodiment.

FIG. 4A and FIG. 4B show plan views illustrating the laser processing unit according to the first exemplary embodiment. FIG. 4A is a plan view illustrating a status of the laser processing unit during an alignment processing. FIG. 4B is a plan view illustrating a status of the laser processing unit during a laser processing. FIG. 5 is a front view illustrating the laser processing unit according to the first exemplary embodiment. FIG. 6 is a side view illustrating a processing head unit and a substrate holder according to the first exemplary embodiment.

The laser processing unit 100 includes a substrate holder 110, an alignment unit 120, a processing head unit 130, a processing head elevation unit 135, a substrate moving unit 140 and the controller 20. Although FIG. 2 illustrates that the controller 20 is provided separately from the laser processing unit 100, the controller 20 may be provided as a part of the laser processing unit 100.

The substrate holder 110 is configured to horizontally hold the substrate 10 from below. As illustrated in FIG. 6, the substrate 10 is placed on an upper surface of the substrate holder 110 in a state where the first main surface 11 protected by the protective tape 14 faces downward. The substrate holder 110 holds the substrate 10 via the protective tape 14. For example, a vacuum chuck may be used as the substrate holder 110, but an electrostatic chuck may also be used.

The alignment unit 120 is configured to detect the dividing target lines 13 (see FIG. 1) of the substrate 10 held on the substrate holder 110. The dividing target lines 13 are set on a plurality of streets formed in a lattice shape in advance on the first main surface 11 of the substrate 10.

The alignment unit 120 includes, for example, an imaging unit 121 configured to take an image of the substrate 10 held on the substrate holder 110. In the present exemplary embodiment, the imaging unit 121 is configured not to be horizontally movable with respect to a fixing table 101, but may be configured to be horizontally movable with respect to the fixing table 101. The imaging unit 121 may be configured to be vertically movable with respect to the fixing table 101 in order to adjust a height of the focus of the imaging unit 121.

The imaging unit 121 is provided above the substrate holder 110 and images streets formed in advance on a lower surface (for example, the first main surface 11) of the substrate 10 from above the substrate 10 held on the substrate holder 110. In this case, an infrared camera configured to take an infrared image penetrating the substrate 10 may be used as the imaging unit 121.

The imaging unit 121 is configured to convert the image of the substrate 10 into an electrical signal to transmit the electrical signal to the controller 20. The controller 20 performs an image processing on the image of the substrate 10 taken by the imaging unit 121 before the laser processing to detect the positions of the dividing target lines 13 of the substrate 10. The positions of the dividing target lines 13 may be detected by using known methods such as a method of matching a street pattern formed in advance in the lattice shape on the first main surface 11 of the substrate 10 with a reference pattern, a method of obtaining the center point of the substrate 10 and the direction of the substrate 10 from a plurality of points on an outer periphery of the substrate 10, or the like. The direction of the substrate 10 may be detected from the position of the notch 19 (see FIG. 1) formed in the outer periphery of the substrate 10. Instead of the notch 19, an orientation flat may be used. Thus, the controller 20 may figure out the positions of the dividing target lines 13 of the substrate 10 in a coordinate system fixed to the substrate holder 110. Also, the image processing may be performed simultaneously with the taking of the image or after the taking of the image.

The alignment unit 120 may also serve as an inspection unit configured to detect the result of the laser processing of the substrate 10 in order to reduce the cost and the installation space. The result of the laser processing may be an abnormality in the laser processing. The abnormality in the laser processing may include, for example, deviation between processing traces on the substrate 10 formed by radiating the processing laser beam LB1 (see FIG. 6) and the dividing target lines 13, chipping, or the like.

The imaging unit 121 images the processing traces on the substrate 10 formed by emitting the processing laser beam LB1 (see FIG. 6). If a modification layer 15 is formed within the substrate 10, an infrared camera configured to take an infrared image of the substrate 10 may be used as the imaging unit 121.

The imaging unit 121 is configured to convert the image of the substrate 10 into an electrical signal to transmit the electrical signal to the controller 20. The controller 20 performs an image processing on the image of the substrate 10 taken by the imaging unit 121 after the laser processing to detect the result of the laser processing of the substrate 10. The image processing may be performed simultaneously with the taking of the image or after the taking of the image.

Further, in the present exemplary embodiment, the alignment unit 120 also serves as the inspection unit, but may not serve as the inspection unit. That is, the alignment unit 120 may be provided separately from the inspection unit. In this case, the inspection unit may be provided as a part of the laser processing unit 100 or may be provided outside the laser processing unit 100.

The processing head unit 130 has a housing 131 accommodating therein an optical system configured to radiate the processing laser beam LB1 toward an upper surface (for example, the second main surface 12) of the substrate 10 from above. The processing head unit 130 is configured not to be horizontally movable with respect to the fixing table 101, but may be configured to be horizontally movable with respect to the fixing table 101.

In the present exemplary embodiment, the processing laser beam LB1 forms the modification layer 15 which serves as a cutting point within the substrate 10 as illustrated in FIG. 6. When forming the modification layer 15 within the substrate 10, a laser beam having permeability to the substrate 10 is used. The modification layer 15 is formed by, for example, locally melting and solidifying the inside of the substrate 10.

Also, in the present exemplary embodiment, the processing laser beam LB1 forms the modification layer 15 serving as the cutting point within the substrate 10, but may form a laser processing groove in the upper surface of the substrate 10. The laser processing groove may or may not penetrate through the substrate 10 in a plate thickness direction. In this case, a laser beam having absorptivity to the substrate 10 is used.

The processing head elevation unit 135 is configured to vertically move the processing head unit 130 with respect to the fixing table 101 to adjust a distance between the processing head unit 130 and the substrate 10. The processing head elevation unit 135 is configured with, for example, a servo motor and a ball screw configured to convert a rotational motion of the servo motor into a linear motion.

When viewed from the Z-axis direction, the substrate moving unit 140 moves the substrate holder 110 with respect to the fixing table 101. The substrate moving unit 140 moves the substrate holder 110 in the X-axis direction, the Y-axis direction and the θ direction. Also, the substrate moving unit 140 may move the substrate holder 110 in the Z-axis direction.

The substrate moving unit 140 is equipped with Y-axis guides 142 extended in the Y-axis direction and a Y-axis slider 143 which is movable along the Y-axis guides 142. As a driving source for moving the Y-axis slider 143 in the Y-axis direction, a servo motor or the like may be used. A rotational motion of the servo motor is converted into a linear motion of the Y-axis slider 143 by a motion converting mechanism such as a ball screw or the like. Further, the substrate moving unit 140 is equipped with X-axis guides 144 extended in the X-axis direction and an X-axis slider 145 which is movable along the X-axis guides 144. As a driving source for moving the X-axis slider 145 in the X-axis direction, a servo motor or the like may be used. A rotational motion of the servo motor is converted into a linear motion of the X-axis slider 145 by a motion converting mechanism such as a ball screw or the like. Further, the substrate moving unit 140 has a rotation table 146 (see FIG. 5) configured to be rotated in the θ direction. As a driving source for rotating the rotation table 146 in the θ direction, a servo motor or the like may be used.

For example, the Y-axis guides 142 are fixed to the fixing table 101. The Y-axis guides 142 are provided throughout the alignment unit 120 and the processing head unit 130 when viewed from the Z-axis direction. The X-axis guides 144 are fixed to the Y-axis slider 143 which moves along the Y-axis guides 142. The rotation table 146 is provided to be rotatable on the X-axis slider 145 which moves the X-axis guides 144. The substrate holder 110 is fixed to the rotation table 146.

Figure 7:
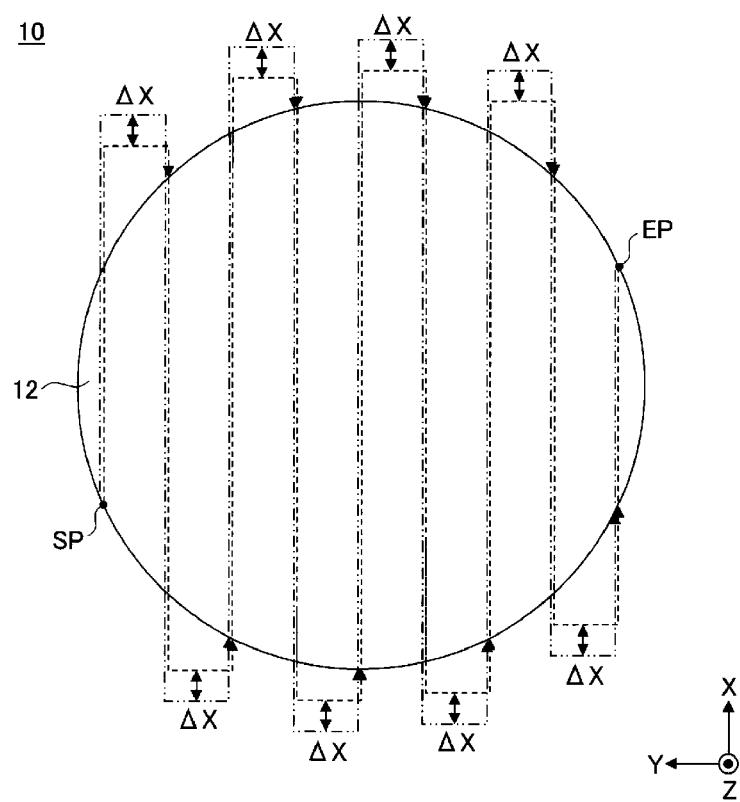
FIG. 7 is a plan view illustrating a moving path of an irradiation point of a processing laser beam on an upper surface of a substrate and an extended surface horizontally extended from the upper surface according to the first exemplary embodiment.

FIG. 7 is a plan view illustrating a moving path of an irradiation point of a processing laser beam on an upper surface of a substrate and an extended surface horizontally extended from the upper surface according to the first exemplary embodiment. As will be described in detail later, a dashed line arrow in FIG. 7 indicates a moving path in a case where a vertical direction position of a light condensing unit 152 is controlled using a coaxial laser displacement meter 161, which will be described below. Also, a dashed double-dotted line arrow in FIG. 7 indicates a moving path in a case where the vertical direction position of the light condensing unit 152 is controlled using a separate-axis laser displacement meter 181.

The controller 20 controls the substrate moving unit 140 to move the substrate holder 110 so that the processing laser beam LB1 is radiated to a point SP (hereinafter, also referred to as "processing start point SP") of the dividing target line 13 detected by the alignment unit 120.

Then, the controller 20 moves the substrate holder 110 in the X-axis direction to move an irradiation point P1 of the processing laser beam LB1 (hereinafter, also referred to as "processing irradiation point P1") in the X-axis direction on the upper surface of the substrate 10 held on the substrate holder 110. Thus, a processing trace extended in the X-axis direction is formed. A Y-axis directional position and a θ directional position of the substrate holder 110 are controlled in advance to match the processing trace with the dividing target line 13.

Then, the controller 20 repeats moving the substrate holder 110 in the Y-axis direction and moving the substrate holder 110 in the X-axis direction to move the processing irradiation point P1 to a point EP (hereinafter, also referred to as "processing end point EP") on the dividing target line 13. Thus, a plurality of processing traces extended in the X-axis direction is formed at an interval along the Y-axis direction.

Further, each processing trace extended in the X-axis direction may have any one of a dotted line shape and a straight line shape. The processing trace having the dotted line shape is formed using the processing laser beam LB1 oscillated in a pulse shape. The processing trace having the straight line shape is formed using the processing laser beam LB1 oscillated continuously.

Then, the controller 20 rotates the substrate holder 110 by 90° in the θ direction and then again forms a plurality of processing traces extended in the X-axis direction at an interval along the Y-axis direction. Thus, the processing traces can be formed along the dividing target lines 13 formed in the lattice shape on the substrate 10 held on the substrate holder 110.

In the present exemplary embodiment, the processing traces extended in the X-axis direction are formed at the interval along the Y-axis direction as illustrated in FIG. 4B and FIG. 7, but a plurality of processing traces extended in the Y-axis direction may be formed at an interval along the X-axis direction.

Also, in the present exemplary embodiment, the substrate moving unit 140 is used as an irradiation point moving unit configured to move the processing irradiation point P1, but the technology of the present disclosure is not limited thereto. The processing irradiation point P1 can be moved by moving at least one of the substrate 10 or the processing head unit 130.

Figure 8:
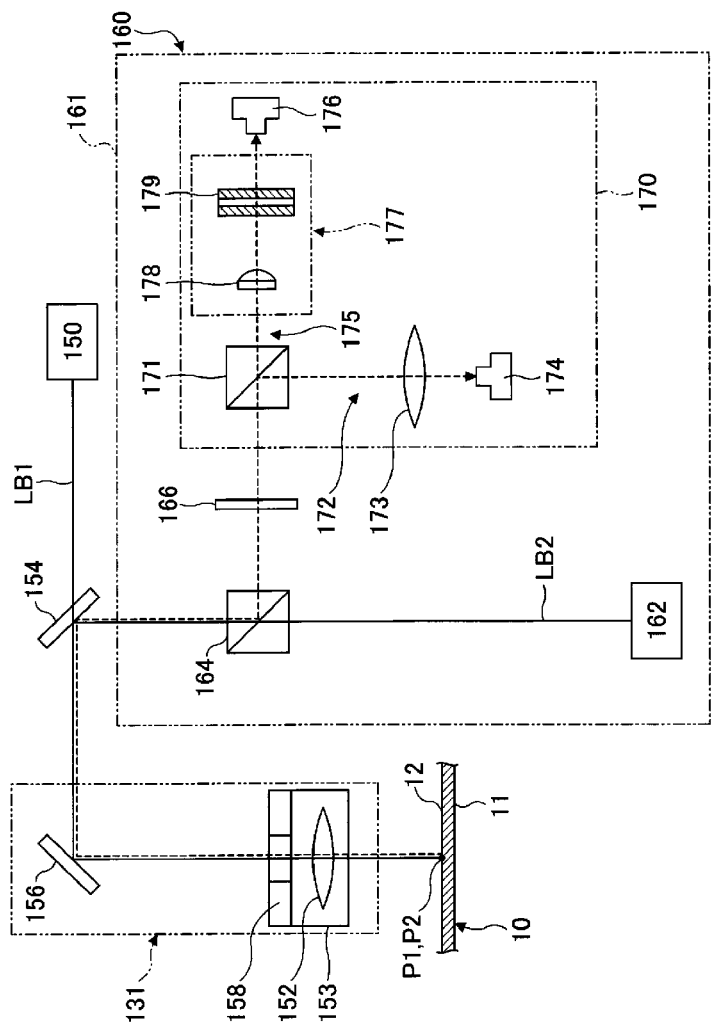
FIG. 8 illustrates a path of the processing laser beam and a path of a first measurement laser beam according to the first exemplary embodiment.

FIG. 8 illustrates a path of the processing laser beam and a path of a first measurement laser beam according to the first exemplary embodiment. As illustrated in FIG. 8, the laser processing unit 100 includes a processing laser oscillator 150 configured to oscillate the processing laser beam LB1 for processing the substrate 10 and the light condensing unit 152 configured to condense the processing laser beam LB1 from above to below the processing irradiation point P1. The processing laser oscillator 150 is provided, for example, outside the housing 131 of the processing head unit 130 and fixed to the fixing table 101. Meanwhile, the light condensing unit 152 is accommodated in the housing 131 of the processing head unit 130 and moved along with the housing 131 in the vertical direction with respect to the fixing table 101.

The processing laser oscillator 150 generates, for example, the processing laser beam LB1 having a wavelength that allows the processing laser beam LB1 to be transmitted through the substrate 10. For example, a $YVO_4$ pulse laser oscillator or a YAG pulse laser oscillator is used as the processing laser oscillator 150. The processing laser beam LB1 has a wavelength of, for example, 1064 nm. A plurality of processing laser oscillators 150 may be provided to change the wavelength of the processing laser beam LB1 and may be replaceable. After the processing laser beam LB1 oscillated by the processing laser oscillator 150 is transmitted through, for example, the dichroic mirror 154, a direction of the processing laser beam LB1 is changed by a direction changing mirror 156, and then, the processing laser beam LB1 is guided to the light condensing unit 152.

The light condensing unit 152 includes a condensing lens. The condensing lens condenses the processing laser beam LB1 oscillated by the processing laser oscillator 150, for example, within the substrate 10. Thus, the modification layer 15 (see FIG. 6) is formed within the substrate 10. The light condensing unit 152 is vertically movable within the housing 131 of the processing head unit 130.

As illustrated in FIG. 8, the laser processing unit 100 has a light condensing unit moving unit 158 configured to vertically move the light condensing unit 152 within the housing 131. The light condensing unit moving unit 158 is not particularly limited, but may be, for example, a piezo actuator having high resolution. The piezo actuator includes a piezo element configured to vertically expand/contract according to a voltage applied thereto. The light condensing unit moving unit 158 vertically moves, for example, a light condensing unit case 153, which accommodates therein the light condensing unit 152, to vertically move the light condensing unit 152.

As illustrated in FIG. 8, the laser processing unit 100 includes a height measurement unit 160 configured to measure a vertical direction position of the processing irradiation point P1. The height measurement unit 160 transmits a signal indicative of the measurement result to the controller 20. The controller 20 controls the vertical direction position of the light condensing unit 152 based on the vertical direction position of the processing irradiation point P1 while moving the processing irradiation point P1. Thus, as illustrated in FIG. 6, if the upper surface of the substrate 10 has a curve, the modification layer 15 can be formed to a predetermined depth from the upper surface of the substrate 10. Also, FIG. 6 illustrates that the curve on the upper surface of the substrate 10 are formed due to non-uniformity in the film thickness of a film 18, but may be formed due to non-uniformity in the thickness of a substrate main body 17.

The height measurement unit 160 includes the coaxial laser displacement meter 161 that measures the vertical direction position of the processing irradiation point P1 by radiating a first measurement laser beam LB2 to the upper surface of the substrate 10 and receiving a reflected light of the first measurement laser beam LB2 from the upper surface of the substrate 10. The first measurement laser beam LB2 has a different wavelength from the processing laser beam LB1 and has the same path as the processing laser beam LB1 from the dichroic mirror 154 provided in a path of the processing laser beam LB1 to the upper surface of the substrate 10. That is, on the upper surface of the substrate 10, the processing irradiation point P1 is overlapped with an irradiation point P2 of the first measurement laser beam LB2 (hereinafter, also referred to as "first measurement irradiation point P2").

The coaxial laser displacement meter 161 includes a measurement laser oscillator 162. The measurement laser oscillator 162 is configured to oscillate the first measurement laser beam LB2 having a wavelength that allows the first measurement laser beam LB2 to be reflected from the substrate 10. For example, a He—Ne pulse laser oscillator is used as the measurement laser oscillator 162. The first measurement laser beam LB2 has a wavelength of, for example, 635 nm. After the first measurement laser beam LB2 oscillated by the measurement laser oscillator 162 is transmitted through, for example, a beam splitter 164 and reflected from the dichroic mirror 154, a direction of the first measurement laser beam LB2 is changed by the direction changing mirror 156 and then guided to the light condensing unit 152.

Further, in the present exemplary embodiment, the dichroic mirror 154 allows the processing laser beam LB1 to be transmitted therethrough and also reflects the first measurement laser beam LB2 or vice versa. That is, the dichroic mirror 154 may reflect the processing laser beam LB1 and also allows the first measurement laser beam LB2 to be transmitted therethrough. In either case, the processing irradiation point P1 and the first measurement irradiation point P2 just need to be overlapped with each other on the upper surface of the substrate 10.

When the first measurement laser beam LB2 is radiated to the upper surface of the substrate 10, it is reflected from the upper surface of the substrate 10. After the reflected light is allowed to pass through the light condensing unit 152, a direction of the reflected light is changed by the direction changing mirror 156. Then, after the reflected light is reflected from the dichroic mirror 154 and the beam splitter 164, the reflected light is allowed to pass through a band pass filter 166 and guided to a reflected light receiving unit 170. The band pass filter 166 is configured to allow only a light having the same wavelength (for example, 635 nm) as the first measurement laser beam LB2 to pass therethrough.

The reflected light receiving unit 170 includes a beam splitter 171 configured to split the reflected light passing through the band pass filter 166 into a first light receiving path 172 and a second light receiving path 175. A condensing lens 173 configured to condense the split reflected light 100% and a first light receiving element 174 configured to receive the reflected light condensed by the condensing lens 173 are provided in the first light receiving path 172. The first light receiving element 174 transmits, to the controller 20, a voltage signal corresponding to the intensity of the reflected light received by the first light receiving element 174.

Meanwhile, a second light receiving element 176 configured to receive the split reflected light and a light receiving area regulation unit 177 configured to regulate a light receiving area for the reflected light received by the second light receiving element 176 are provided in the second light receiving path 175. The light receiving area regulation unit 177 includes, for example, a cylindrical lens 178 configured to one-dimensionally condense the split reflected light and a one-dimensional mask 179 configured to regulate the reflected light one-dimensionally condensed by the cylindrical lens 178 per unit length. The reflected light passing through the one-dimensional mask 179 is received by the second light receiving element 176, and a voltage signal corresponding to the intensity of the received reflected light is transmitted to the controller 20.

Figure 9:
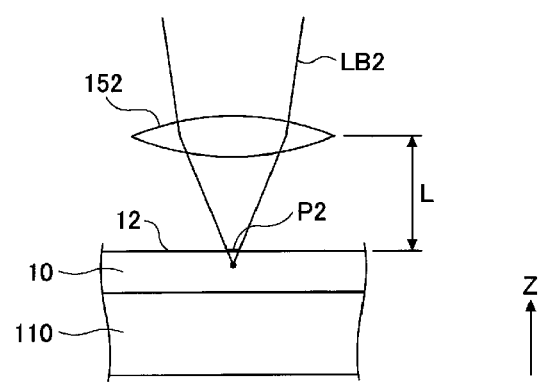
FIG. 9 shows a relationship between a vertical direction position of an irradiation point of the first measurement laser beam on the upper surface of the substrate and a size of the irradiation point of the first measurement laser beam on the upper surface of the substrate according to the first exemplary embodiment.

FIG. 9 shows a relationship between a vertical direction position of an irradiation point of the first measurement laser beam on the upper surface of the substrate and a size of the irradiation point of the first measurement laser beam on the upper surface of the substrate according to the first exemplary embodiment. The first measurement laser beam LB2 is condensed onto the substrate 10 by the light condensing unit 152. Thus, the first measurement irradiation point P2 having a size corresponding to a distance L between the light condensing unit 152 and the substrate 10 is formed on the upper surface of the substrate 10. The reflected light reflected from the first measurement irradiation point P2 is split into the first light receiving path 172 and the second light receiving path 175 by the beam splitter 171.

All the reflected light split into the first light receiving path 172 is condensed onto the first light receiving element 174 by the condensing lens 173. For this reason, the intensity of the reflected light received by the first light receiving element 174 is uniform regardless of the size of the first measurement irradiation point P2. Therefore, a voltage V1 output from the first light receiving element 174 becomes uniform regardless of the vertical direction position of the first measurement irradiation point P2.

Meanwhile, the reflected light split into the second light receiving path 175 is one-dimensionally condensed by the cylindrical lens 178. Here, as the size of the first measurement irradiation point P2 increases, the length of the one-dimensionally condensed reflected light increases. Further, the one-dimensionally condensed reflected light is regulated per a predetermined unit length by the one-dimensional mask 179 and then received by the second light receiving element 176. For this reason, as the size of the first measurement irradiation point P2 increases, the intensity of the reflected light received by the second light receiving element 176 decreases. As such, the intensity of the reflected light received by the second light receiving element 176 is changed by the size of the first measurement irradiation point P2. Therefore, a voltage V2 output from the second light receiving element 176 is changed depending on the vertical direction position of the first measurement irradiation point P2.

The controller 20 obtains the vertical direction position of the first measurement irradiation point P2 based on a voltage ratio V1/V2 between the voltage V1 output from the first light receiving element 174 and the voltage V2 output from the second light receiving element 176. When the vertical direction position of the first measurement irradiation point P2 is obtained, a map showing the relationship between the vertical direction position of the first measurement irradiation point P2 and the voltage ratio V1/V2 is used. This map is created in advance by experiments to be stored in the storage 22. Since the first measurement irradiation point P2 and the processing irradiation point P1 are overlapped with each other on the upper surface of the substrate 10, the vertical direction position of the processing irradiation point P1 can be obtained by obtaining the vertical direction position of the first measurement irradiation point P2.

All the reflected light split into the first light receiving path 172 is received by the first light receiving element 174, whereas only a part of the reflected light split into the second light receiving path 175 is received by the second light receiving element 176. For this reason, if the intensity of the reflected light split into the first light receiving path 172 is equal to that of the reflected light split into the second light receiving path 175, the voltage V2 output from the second light receiving element 176 is smaller than the voltage V1 output from the first light receiving element 174.

In some cases, the upper surface of the substrate 10 that reflects the first measurement laser beam LB2 may be formed of a film 18 (see FIG. 6) such as a silicon oxide film or silicon nitride film. As illustrated in FIG. 6, the substrate 10 includes the substrate main body 17 such as a silicon wafer and the film 18 formed on the surface of the substrate main body 17. The film 18 may have a single layer structure or a multilayer structure. The film 18 is unintentionally formed while a device is formed, and, thus, a film thickness of the film 18 may not be uniform. The non-uniformity of the film thickness may occur within a single substrate 10 or between a plurality of substrates 10.

Figure 10:
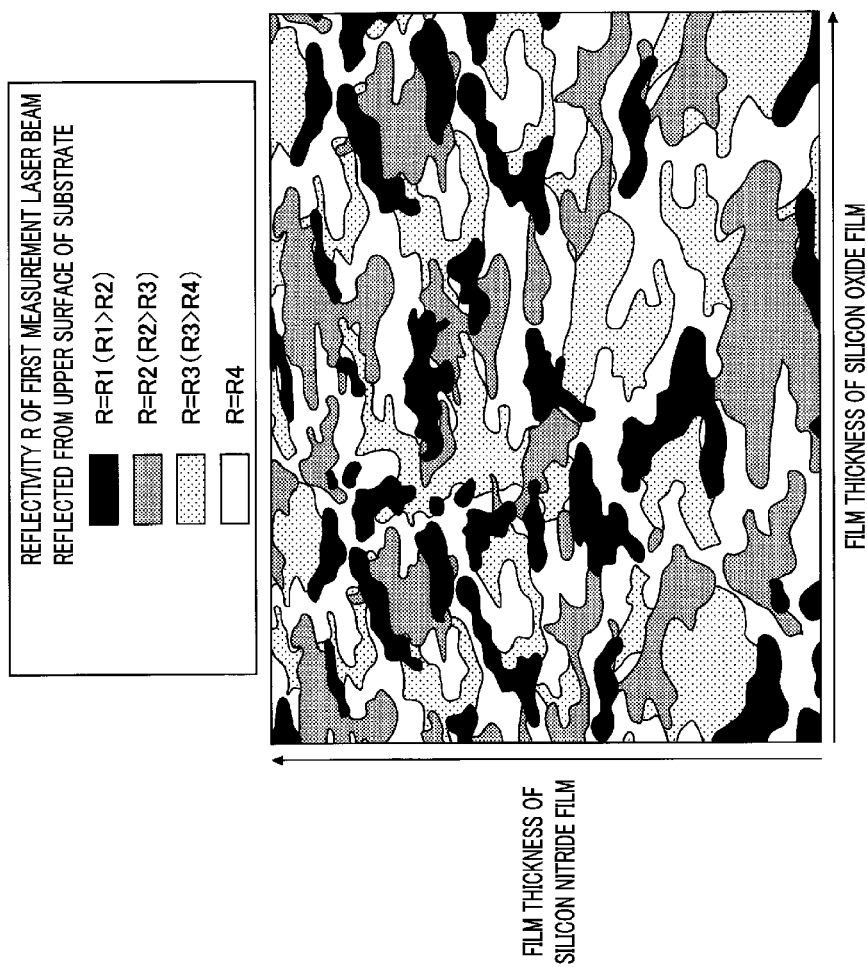
FIG. 10 schematically shows a relationship between a material and a film thickness of a film, which forms the upper surface of the substrate, and a reflectivity of the first measurement laser beam from the upper surface of the substrate according to the first exemplary embodiment.

FIG. 10 schematically shows a relationship between the material and the film thickness of the film, which forms the upper surface of the substrate, and a reflectivity of the first measurement laser beam from the upper surface of the substrate according to the first exemplary embodiment. In FIG. 10, the horizontal axis represents the film thickness of the silicon oxide film, which forms the film 18, and the longitudinal axis represents the film thickness of the silicon nitride film, which forms the film 18. The film 18 may include both or any one of the silicon oxide film or the silicon nitride film.

As illustrated in FIG. 10, when the silicon nitride film has the same film thickness, as the film thickness of the silicon oxide film increases, a reflectivity R of the first measurement laser beam LB2 from the upper surface of the substrate 10 increases and decreases repeatedly. Likewise, when the silicon oxide film has the same film thickness, as the film thickness of the silicon nitride film increases, the reflectivity R of the first measurement laser beam LB2 from the upper surface of the substrate 10 increases and decreases repeatedly.

As such, the reflectivity R of the first measurement laser beam LB2 from the upper surface of the substrate 10 is changed depending on the material and the film thickness of the film 18, which forms the upper surface of the substrate 10, and, thus, the intensity of the reflected light received by the reflected light receiving unit 170 changes. For this reason, if the output of the measurement laser oscillator 162 is not sufficient, the voltage V2 corresponding to the intensity of the reflected light received by the second light receiving element 176 may be lower than a threshold value $V2_0$ (for example, 0.3 V). The threshold value $V2_0$ is the lower limit for measuring the vertical direction position of the first measurement irradiation point P2.

Also, in the present exemplary embodiment, a confocal type laser displacement meter is used as the coaxial laser displacement meter 161, but a measurement method of the laser displacement meter is not particularly limited. The measurement method of the laser displacement meter may be any one of, for example, a confocal method, a triangulation method, a time-of-flight method and an interference method. The laser displacement meter includes a laser oscillator and a light receiving element regardless of the measurement method of the laser displacement meter, and a laser beam oscillated by the laser oscillator is reflected from the upper surface of the substrate 10 and the reflected light is received by the light receiving element. For this reason, if the output of the laser oscillator is not sufficient, the intensity of the reflected light received by the light receiving element may be lower than the lower limit.

Therefore, the height measurement unit 160 according to the present exemplary embodiment includes the separate-axis laser displacement meter 181 in addition to the coaxial laser displacement meter 161 as illustrated in FIG. 6. A measurement method of the separate-axis laser displacement meter 181 may be identical to or different from that of the coaxial laser displacement meter 161. The measurement method of the separate-axis laser displacement meter 181 may be any one of, for example, the confocal method, the triangulation method, the time-of-flight method and the interference method. Together with the coaxial laser displacement meter 161, the separate-axis laser displacement meter 181 is accommodated in the housing 131 of the processing head unit 130.

The separate-axis laser displacement meter 181 measures the vertical direction position of the processing irradiation point P1 by radiating a second measurement laser beam LB3 to the upper surface of the substrate 10 and receiving a reflected light of the second measurement laser beam LB3 from the upper surface of the substrate 10. The second measurement laser beam LB3 has a different wavelength and a different path from the processing laser beam LB1 and the first measurement laser beam LB2. On the upper surface of the substrate 10, the processing irradiation point P1 or the first measurement irradiation point P2 is away from an irradiation point P3 of the second measurement laser beam LB3 (hereinafter, referred to as "second measurement irradiation point P3") by a predetermined distance $\Delta X$ in the X-axis direction. The separate-axis laser displacement meter 181 measures the vertical direction position of the processing irradiation point P1 by measuring a vertical direction position of the second measurement irradiation point P3.

The separate-axis laser displacement meter 181 is provided at both sides of the light condensing unit 152 in the X-axis direction. The controller 20 controls the separate-axis laser displacement meter 181 on the positive X-axis direction side (right side in FIG. 6) to measure the vertical direction position of the processing irradiation point P1 and controls the vertical direction position of the light condensing unit 152 based on the result of measurement while moving the substrate 10 toward the negative X-axis direction (left direction in FIG. 6). Meanwhile, the controller 20 controls the separate-axis laser displacement meter 181 on the negative X-axis direction side (left side in FIG. 6) to measure the vertical direction position of the processing irradiation point P1 and controls the vertical direction position of the light condensing unit 152 based on the result of measurement while moving the substrate 10 toward the positive X-axis direction (right direction in FIG. 6).

While the separate-axis laser displacement meter 181 measures the vertical direction position of the processing irradiation point P1, the substrate 10 is moved in the X-axis direction at a constant velocity V. Also, while the processing irradiation point P1 is moved on the upper surface of the substrate 10, the substrate 10 is moved in the X-axis direction at a constant velocity V. Thus, the separate-axis laser displacement meter 181 can obtain the vertical direction position of the processing irradiation point P1 before a predetermined time period $\Delta X/V$.

Meanwhile, as described above, the second measurement laser beam LB3 has the different wavelength and the different path from the processing laser beam LB1 and the first measurement laser beam LB2. For this reason, the wavelength of the second measurement laser beam LB3 can be set regardless of the design of an optical system such as the dichroic mirror 154. The second measurement laser beam LB3 may have a single wavelength or a plurality of wavelengths. In the latter case, a plurality of second measurement laser beams LB3 having different wavelengths from each other may be simultaneously emitted to the upper surface of the substrate 10.

Figure 11:
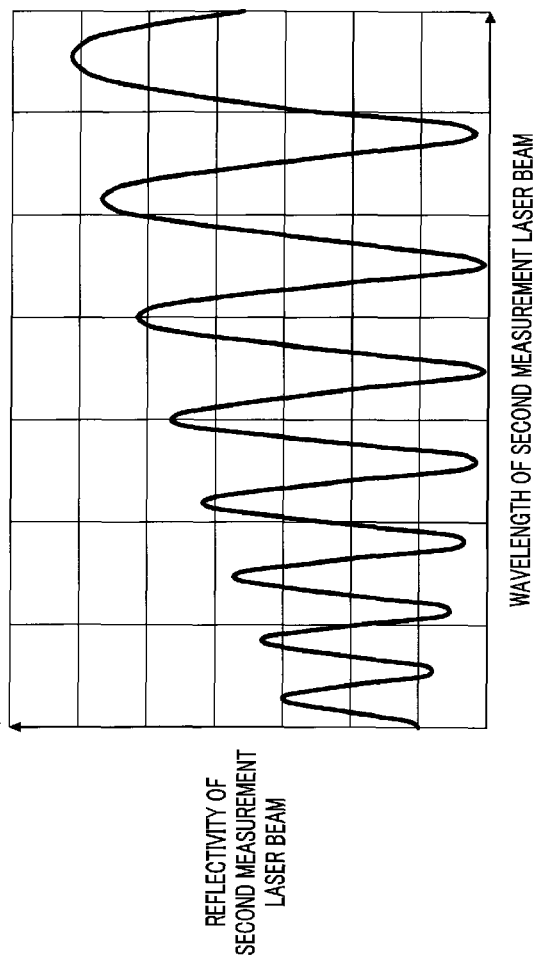
FIG. 11 is a schematic diagram showing a relationship between a reflectivity of a second measurement laser beam reflected from the upper surface of the substrate and a wavelength thereof according to the first exemplary embodiment.

FIG. 11 is a schematic diagram showing a relationship between the reflectivity of the second measurement laser beam reflected from the upper surface of the substrate and the wavelength thereof according to the first exemplary embodiment. In FIG. 11, the material and the film thickness of the film 18, which forms the upper surface of the substrate 10, are uniform. As shown in FIG. 11, as the wavelength of the second measurement laser beam LB3 increases, the reflectivity of the second measurement laser beam LB3 increases and decreases repeatedly.

According to the present exemplary embodiment, the wavelength of the second measurement laser beam LB3 can be set regardless of the design of the optical system such as the dichroic mirror 154. For this reason, if the reflectivity of the first measurement laser beam LB2 is low, the wavelength of the second measurement laser beam LB3 may be set to increase the reflectivity of the second measurement laser beam LB3. Therefore, if the vertical direction position of the processing irradiation point P1 cannot be measured by the coaxial laser displacement meter 161, the vertical direction position of the processing irradiation point P1 can be measured by the separate-axis laser displacement meter 181.

If the separate-axis laser displacement meter 181 is used as the laser displacement meter for controlling the vertical direction position of the light condensing unit 152, the moving path of the processing irradiation point P1 is lengthened as shown in FIG. 6, compared to a case where the coaxial laser displacement meter 161 is used. This is because if the separate-axis laser displacement meter 181 is used, a distance for moving the substrate 10 at the constant velocity V increases, compared to a case where the coaxial laser displacement meter 161 is used. The distance increases by 2×ΔX while a movement direction of the processing irradiation point P1 is changed once from the positive X-axis direction to the negative X-axis direction. Also, the distance increases by 2×ΔX while the movement direction of the processing irradiation point P1 is changed once from the negative X-axis direction to the positive X-axis direction.

According to the present exemplary embodiment, the controller 20 basically uses the coaxial laser displacement meter 161 as the laser displacement meter for controlling the vertical direction position of the light condensing unit 152 and uses the separate-axis laser displacement meter 181 when the coaxial laser displacement meter 161 cannot measure the vertical direction position of the processing irradiation point P1. Since the controller 20 basically uses the coaxial laser displacement meter 161, it is possible to reduce the processing time of the substrate 10.

Figure 12:
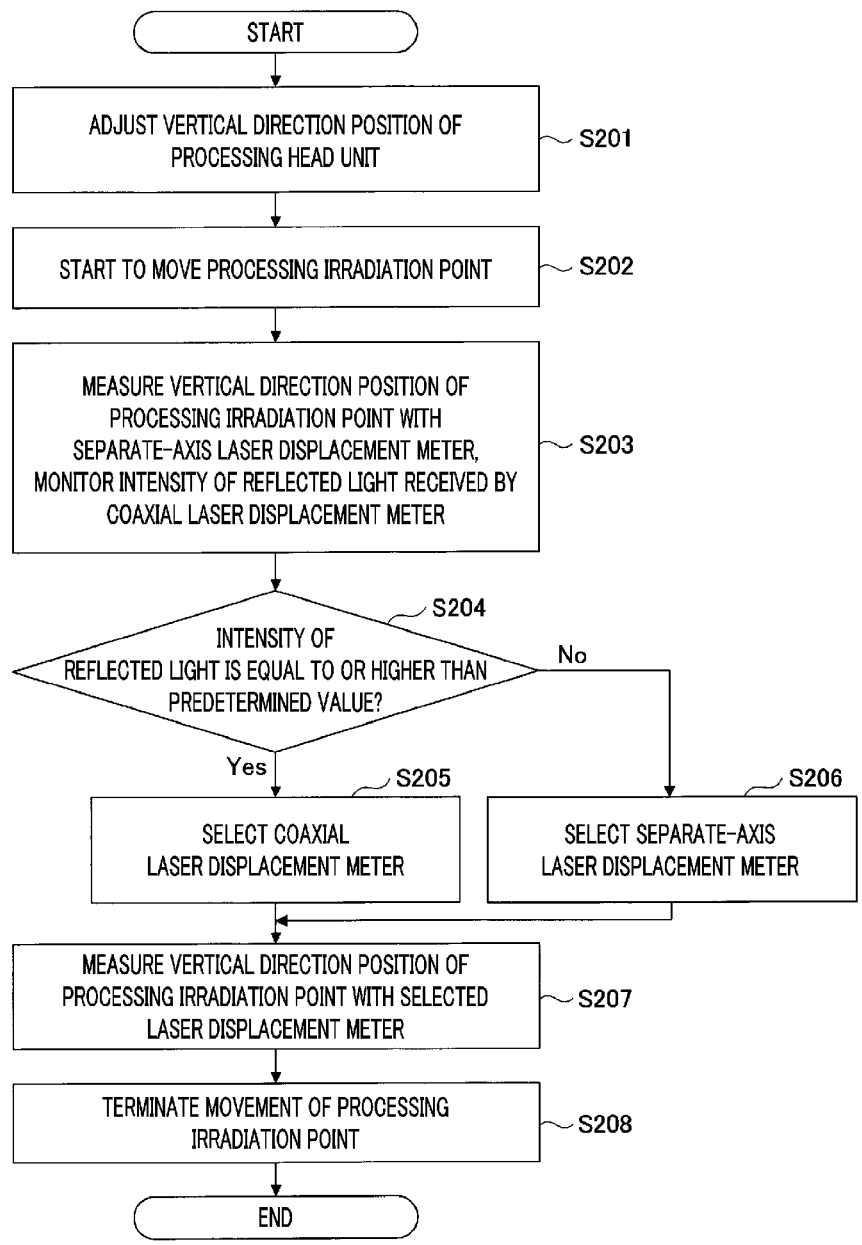
FIG. 12 is a flowchart showing a processing of a controller according to the first exemplary embodiment.

FIG. 12 is a flowchart showing a processing of the controller according to the first exemplary embodiment. The processing shown in FIG. 12 is performed mainly in a case where the film thickness of the film 18 (further, the reflectivity R) is uniform in the entire surface of a single substrate 10 and not uniform between a plurality of substrates 10. The processing after a process S201 shown in FIG. 12 is performed after the dividing target lines 13 are detected by the alignment unit 120.

First, the controller 20 adjusts the vertical direction position of the processing head unit 130 (process S201). Thus, as shown in FIG. 6, the housing 131 of the processing head unit 130 is placed at a predetermined height from the substrate holder 110.

Then, the controller 20 starts to move the processing irradiation point P1 (process S202). Specifically, the controller 20 starts to move the processing irradiation point P1 toward the processing end point EP from the processing start point SP shown in FIG. 7. The controller 20 starts to form the processing trace. As the laser displacement meter used for controlling the vertical direction position of the light condensing unit 152 during the formation of the first processing trace, the separate-axis laser displacement meter 181 is selected. The controller 20 controls the separate-axis laser displacement meter 181 to measure the vertical direction position of the processing irradiation point P1 before the formation of the first processing trace, for example, from the time period ΔX/V before the formation of the first processing trace.

Then, the controller 20 controls the separate-axis laser displacement meter 181 to measure the vertical direction position of the processing irradiation point P1 and controls the vertical direction position of the light condensing unit 152 based on the measurement result thereof, and also monitors the intensity of the reflected light received by the second light receiving element 176 of the coaxial laser displacement meter 161 (process S203). The process S203 is performed, for example, while the processing irradiation point P1 is moved on a single dividing target line 13 to process the corresponding single dividing target line 13 extended in the X-axis direction from the processing start point SP.

Then, the controller 20 determines whether the intensity of the reflected light received by the second light receiving element 176 of the coaxial laser displacement meter 161 is equal to or higher than the predetermined value (process S204). Specifically, the controller 20 determines whether the voltage V2 representing the intensity of the reflected light received by the second light receiving element 176 is equal to or greater than the threshold value $V2_0$.

If the intensity of the reflected light received by the second light receiving element 176 of the coaxial laser displacement meter 161 is equal to or higher than the predetermined value (process S204, Yes), the vertical direction position of the processing irradiation point P1 can be measured by the coaxial laser displacement meter 161. Therefore, in this case, the controller 20 selects the coaxial laser displacement meter 161 as the laser displacement meter for controlling the vertical direction position of the light condensing unit 152 while the rest of the substrate 10 is processed (process S205).

Then, the controller 20 controls the selected coaxial laser displacement meter 161 to measure the vertical direction position of the processing irradiation point P1 and moves the processing irradiation point P1 on the other dividing target lines 13 while controlling the vertical direction position of the light condensing unit 152 based on the measurement result thereof (process S207).

Then, when the processing irradiation point P1 reaches the processing end point EP, the controller 20 terminates the movement of the processing irradiation point P1 (process S208) and ends the processing. Thus, the processing traces extended in the X-axis direction are formed at the interval along the Y-axis direction.

Thereafter, the controller 20 rotates the substrate holder 110 by 90° in the θ direction and then again forms processing traces extended in the X-axis direction at an interval along the Y-axis direction. Meanwhile, the coaxial laser displacement meter 161 is used as the laser displacement meter for controlling the vertical direction position of the light condensing unit 152. Thus, the processing traces can be formed along the dividing target lines 13 formed in the lattice shape on the substrate 10.

Therefore, the controller 20 controls the vertical direction position of the light condensing unit 152 by using only any one of the coaxial laser displacement meter 161 and the separate-axis laser displacement meter 181 for each dividing target line 13 while the single substrate 10 is processed with the processing laser beam LB1. Also, the controller 20 switches the laser displacement meter for controlling the vertical direction position of the light condensing unit 152 from the separate-axis laser displacement meter 181 into the coaxial laser displacement meter 161 while the single substrate 10 is processed with the processing laser beam LB1.

Meanwhile, if the intensity of the reflected light received by the second light receiving element 176 of the coaxial laser displacement meter 161 is lower than the predetermined value (process S204, No), the vertical direction position of the processing irradiation point P1 cannot be measured by the coaxial laser displacement meter 161. Therefore, in this case, the controller 20 selects the separate-axis laser displacement meter 181 as the laser displacement meter for controlling the vertical direction position of the light condensing unit 152 while the rest of the substrate 10 is processed (process S206).

Then, the controller 20 controls the selected separate-axis laser displacement meter 181 to measure the vertical direction position of the processing irradiation point P1 and moves the processing irradiation point P1 on the other dividing target lines 13 while controlling the vertical direction position of the light condensing unit 152 based on the measurement result thereof (process S207).

Then, when the processing irradiation point P1 reaches the processing end point EP, the controller 20 terminates the movement of the processing irradiation point P1 (process S208) and ends the processing. Thus, the processing traces extended in the X-axis direction are formed at the interval along the Y-axis direction.

Thereafter, the controller 20 rotates the substrate holder 110 by 90° in the θ direction and then again forms processing traces extended in the X-axis direction at an interval along the Y-axis direction. Meanwhile, the separate-axis laser displacement meter 181 is used as the laser displacement meter for controlling the vertical direction position of the light condensing unit 152. Thus, the processing traces can be formed along the dividing target lines 13 formed in the lattice shape on the substrate 10.

Therefore, the controller 20 controls the vertical direction position the light condensing unit 152 by using only the separate-axis laser displacement meter 181 while the single substrate 10 is processed with the processing laser beam LB1. That is, the controller 20 does not switch the laser displacement meter for controlling the vertical direction position of the light condensing unit 152 from the separate-axis laser displacement meter 181 into the coaxial laser displacement meter 161 while the single substrate 10 is processed with the processing laser beam LB1.

According to the present exemplary embodiment, the controller 20 first controls the vertical direction position of the light condensing unit 152 based on the measurement result by the separate-axis laser displacement meter 181 configured to securely measure the vertical direction position of the processing irradiation point P1 and determines whether the intensity of the reflected light received by the coaxial laser displacement meter 161 is sufficient.

As such, if the controller 20 determines that the intensity of the reflected light received by the coaxial laser displacement meter 161 is sufficient, the controller 20 controls the vertical direction position of the light condensing unit 152 by using the coaxial laser displacement meter 161 instead of the separate-axis laser displacement meter 181 along the way. Therefore, it is possible to shorten the moving path of the processing irradiation point P1 and thus possible to reduce the processing time of the substrate 10.

Meanwhile, if the controller 20 determines that the intensity of the reflected light received by the coaxial laser displacement meter 161 is not sufficient, the controller 20 controls the vertical direction position of the light condensing unit 152 by still using the separate-axis laser displacement meter 181. Therefore, it is possible to avoid the situation that the vertical direction position of the processing irradiation point P1 cannot be measured.

Figure 13:
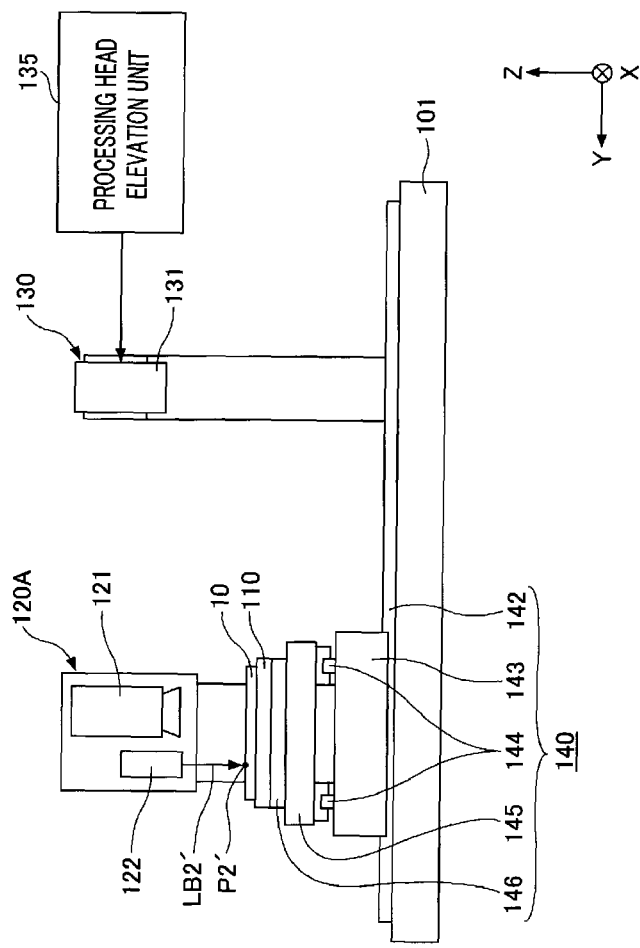
FIG. 13 is a front view illustrating a laser processing unit according to a second exemplary embodiment.

FIG. 13 is a front view illustrating a laser processing unit according to a second exemplary embodiment. As illustrated in FIG. 13, an alignment unit 120A of the present exemplary embodiment includes a reflectivity measurement unit 122 configured to measure a reflectivity of an inspection laser beam LB2' reflected from the upper surface (for example, second main surface 12) of the substrate 10 in addition to the imaging unit 121. The inspection laser beam LB2' has the same wavelength as the first measurement laser beam LB2, and, thus, the reflectivity of the inspection laser beam LB2' is equal to the reflectivity R of the first measurement laser beam LB2. Hereinafter, descriptions will be made focusing on a difference between the present exemplary embodiment and the first exemplary embodiment.

The reflectivity measurement unit 122 includes a laser oscillator configured to oscillate the inspection laser beam LB2' and a light receiving element configured to receive a reflected light of the inspection laser beam LB2' reflected from the upper surface of the substrate 10. The light receiving element transmits, to the controller 20, a voltage signal corresponding to the intensity (i.e., reflectivity) of the received reflected light.

The controller 20 selects any one of the coaxial laser displacement meter 161 and the separate-axis laser displacement meter 181 as the laser displacement meter for controlling the vertical direction position of the light condensing unit 152 at a time of processing the substrate based on the reflectivity measured by the reflectivity measurement unit 122. Herein, the time of processing the substrate refers to a time point of moving the processing irradiation point P1 on the dividing target lines 13 of the substrate 10. At the time of processing the substrate, the laser displacement meter for controlling the vertical direction position of the light condensing unit 152 is selected for each of the dividing target lines 13.

While the processing irradiation point P1 is moved on a single dividing target line 13, the laser displacement meter for controlling the vertical direction position of the light condensing unit 152 is not switched. Since the first measurement irradiation point P2 is away from the second measurement irradiation point P3 by a predetermined distance ΔX in the X-axis direction, if the laser displacement meter is switched from the coaxial laser displacement meter 161 into the separate-axis laser displacement meter 181 along the way, there may be a portion where the vertical direction position of the processing irradiation point P1 cannot be measured. The controller 20 controls the vertical direction position the light condensing unit 152 by using only any one of the coaxial laser displacement meter 161 and the separate-axis laser displacement meter 181 for each dividing target line 13.

Figure 14:
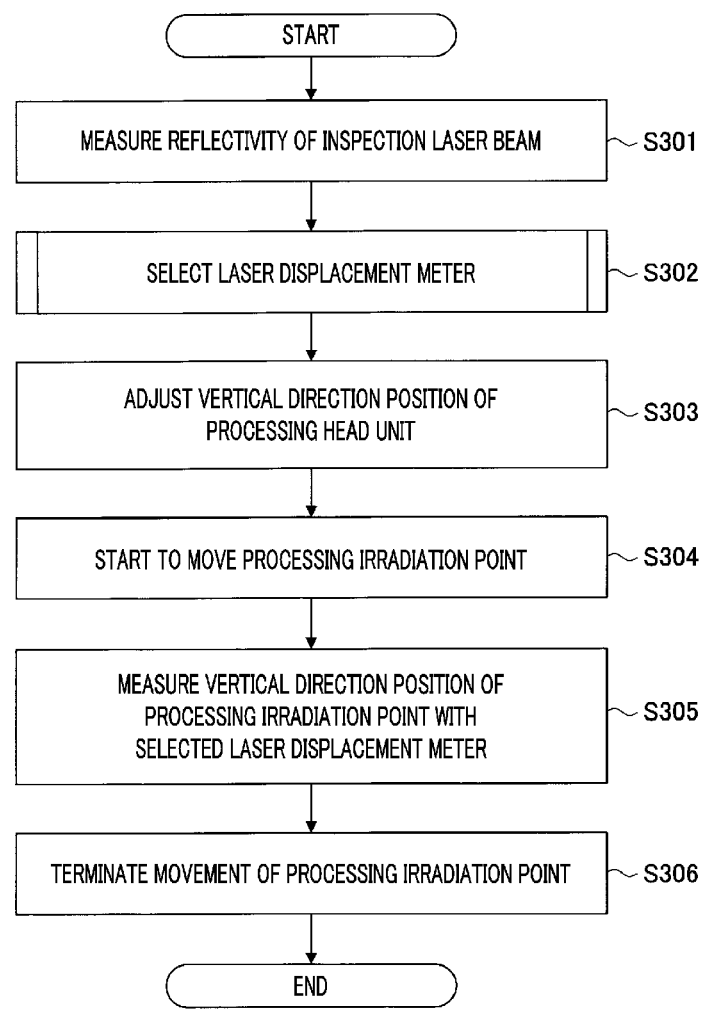
FIG. 14 is a flowchart showing a processing of a controller according to the second exemplary embodiment.
Figure 15:
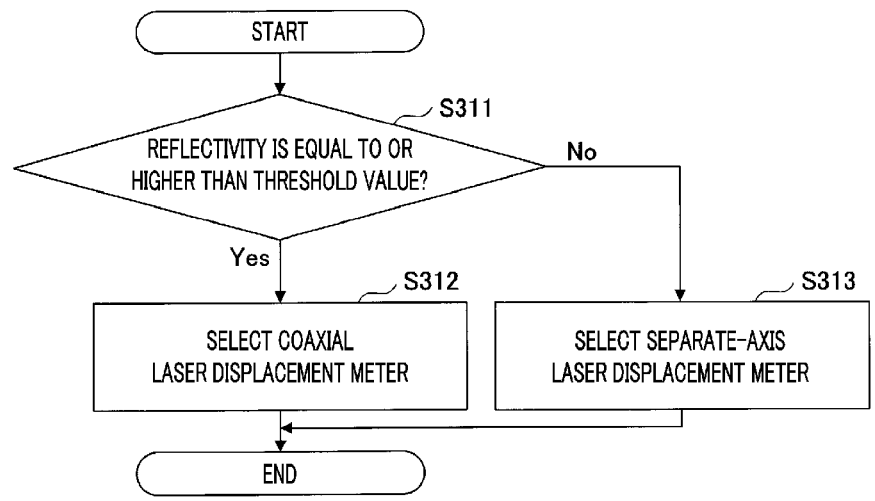
FIG. 15 is a flowchart showing a processing in a process S302 illustrated in FIG. 14.

FIG. 14 is a flowchart showing a processing of a controller according to the second exemplary embodiment. FIG. 15 is a flowchart showing a processing in a process S302 illustrated in FIG. 14. The processing shown in FIG. 14 is performed in a case where the film thickness of the film 18 (further, the reflectivity) is not uniform in the surface of the single substrate 10. Also, the processing shown in FIG. 14 can be performed in a case where the film thickness of the film 18 is uniform in the entire surface of the single substrate 10 and not uniform between a plurality of substrates 10. The processing after a process S301 shown in FIG. 14 is started, for example, when the transfer unit 58 places the substrate 10 on the substrate holder 110.

First, the controller 20 controls the reflectivity measurement unit 122 to measure the reflectivity of the inspection laser beam LB2' reflected from the upper surface of the substrate 10 (process S301). For example, the controller 20 controls the reflectivity measurement unit 122 to measure the reflectivity of the inspection laser beam LB2' while controlling the substrate moving unit 140 to move an irradiation point P2' of the inspection laser beam LB2' (hereinafter, also referred to as "inspection irradiation point P2'") on the upper surface of the substrate 10. The inspection irradiation point P2' is moved on a dividing target line 13, and the reflectivity of the inspection laser beam LB2' is stored corresponding to the position of the inspection irradiation point P2' on the dividing target line 13. The reflectivity of the inspection laser beam LB2' is equal to the reflectivity of the first measurement laser beam LB2.

Then, the controller 20 selects the coaxial laser displacement meter 161 or the separate-axis laser displacement meter 181 as the laser displacement meter for controlling the vertical direction position of the light condensing unit 152 at the time of processing the substrate based on the reflectivity measured by the reflectivity measurement unit 122 (process S302). This selection is performed for each of the dividing target lines 13.

Specifically, as illustrated in FIG. 15, the controller 20 determines whether the reflectivity of the inspection laser beam LB2' (further, the reflectivity R of the first measurement laser beam LB2) is equal to or higher than a threshold value $R_0$ (process S311). This determination is performed for each of the dividing target lines 13.

If the reflectivity R is equal to or higher than the threshold value $R_0$ (process S311, Yes), the voltage V2 representing the intensity of the reflected light received by the second light receiving element 176 of the coaxial laser displacement meter 161 is equal to or higher than the threshold value $V2_0$. For this reason, the coaxial laser displacement meter 161 measures the vertical direction position of the processing irradiation point P1. Therefore, in this case, the controller 20 selects the coaxial laser displacement meter 161 as the laser displacement meter for controlling the vertical direction position of the light condensing unit 152 (process S312).

Meanwhile, if the reflectivity R is lower than the threshold value $R_0$ (process S311, No), the voltage V2 representing the intensity of the reflected light received by the second light receiving element 176 of the coaxial laser displacement meter 161 is lower than the threshold value $V2_0$. For this reason, the coaxial laser displacement meter 161 cannot measure the vertical direction position of the processing irradiation point P1. Therefore, in this case, the controller 20 selects the separate-axis laser displacement meter 181 as the laser displacement meter for controlling the vertical direction position of the light condensing unit 152 (process S313).

Herein, the threshold value $R_0$ is set considering an assumed variation range of the vertical direction position of the processing irradiation point P1. The size of the first measurement irradiation point P2 is changed depending on the vertical direction position of the processing irradiation point P1, i.e., the vertical direction position of the first measurement irradiation point P2, and as the size of the first measurement irradiation point P2 increases, the intensity of the reflected light received by the second light receiving element 176 decreases.

Then, the controller 20 adjusts the vertical direction position of the processing head unit 130 (process S303). Thus, as shown in FIG. 6, the housing 131 of the processing head unit 130 is placed at the predetermined height from the substrate holder 110.

Then, the controller 20 starts to move the processing irradiation point P1 (process S304). Specifically, the controller 20 starts to move the processing irradiation point P1 toward the processing end point EP from the processing start point SP shown in FIG. 7. The controller 20 starts to form the processing trace. As the laser displacement meter used for controlling the vertical direction position of the light condensing unit 152 during the formation of a first processing trace, the separate-axis laser displacement meter 181 may be selected in the process S302. In this case, the controller 20 controls the separate-axis laser displacement meter 181 to measure the vertical direction position of the processing irradiation point P1 before the formation of the first processing trace, for example, from the time period $\Delta X/V$ before the formation of the first processing trace.

Then, the controller 20 controls the laser displacement meter selected in the process S302 to measure the vertical direction position of the processing irradiation point P1 and controls the vertical direction position of the light condensing unit 152 based on the measurement result thereof (process S305). The controller 20 controls the vertical direction position the light condensing unit 152 by using only any one of the coaxial laser displacement meter 161 or the separate-axis laser displacement meter 181 for each dividing target line 13.

Then, when the processing irradiation point P1 reaches the processing end point EP, the controller 20 terminates the movement of the processing irradiation point P1 (process S306) and ends the processing. Thus, the processing traces extended in the X-axis direction are formed at the interval along the Y-axis direction.

Thereafter, the controller 20 rotates the substrate holder 110 by 90° in the θ direction and then again forms processing traces extended in the X-axis direction at an interval along the Y-axis direction. Meanwhile, the laser displacement meter selected in the process S302 is used as the laser displacement meter for controlling the vertical direction position of the light condensing unit 152. Thus, the processing traces can be formed along the dividing target lines 13 formed in the lattice shape on the substrate 10.

According to the present exemplary embodiment, before the substrate is processed, any appropriate one of the coaxial laser displacement meter 161 or the separate-axis laser displacement meter 181 may be selected as the laser displacement meter for controlling the vertical direction position of the light condensing unit 152 at the time of processing the substrate. Therefore, for example, if the film thickness of the film 18 (further, the reflectivity R) is uniform in the entire surface of the single substrate 10, the coaxial laser displacement meter 161 can be selected from the first dividing target line 13, and, thus, it is possible to further reduce the processing time of the substrate 10. Further, if the film thickness of the film 18 (further, the reflectivity R) is not uniform in the surface of the single substrate 10, the laser displacement meter appropriate for each dividing target line 13 can be selected, and, thus, it is possible to securely measure the vertical direction position of the processing irradiation point P1.

If the film thickness of the film 18 (further, the reflectivity R) is not uniform in the surface of the single substrate 10, the controller 20 switches the laser displacement meter for controlling the vertical direction position of the light condensing unit 152 while the single substrate 10 is processed with the processing laser beam LB1. This switchover is performed based on the reflectivity measured by the reflectivity measurement unit 122. Either or both of the switchover from the coaxial laser displacement meter 161 to the separate-axis laser displacement meter 181 and the switchover from the separate-axis laser displacement meter 181 to the coaxial laser displacement meter 161 may be performed. Further, this switchover just needs to be performed once or more. Different laser displacement meters are used, respectively, when one dividing target line 13 is processed and when another dividing target line 13 is processed. The switchover of the laser displacement meter makes it possible to securely measure the vertical direction position of the processing irradiation point P1 and to reduce the processing time of the single substrate 10.

If the film thickness of the film 18 (further, the reflectivity R) is uniform in the entire surface of the single substrate 10 and not uniform between the substrates 10, the controller 20 switches the laser displacement meter for controlling the vertical direction position of the light condensing unit 152 while the substrates 10 are processed with the processing laser beam LB1. This switchover is performed based on the reflectivity measured by the reflectivity measurement unit 122. Either or both of the switchover from the coaxial laser displacement meter 161 to the separate-axis laser displacement meter 181 and the switchover from the separate-axis laser displacement meter 181 to the coaxial laser displacement meter 161 may be performed. Further, the switchover just needs to be performed once or more. The switchover of the laser displacement meter is not performed while the single substrate 10 is processed. Different laser displacement meters are used, respectively, when one substrate 10 is processed and when another substrate 10 is processed. The switchover of the laser displacement meter makes it possible to securely measure the vertical direction position of the processing irradiation point P1 and to reduce the processing time of the substrates 10.

Also, in the present exemplary embodiment, the reflectivity measurement unit 122 is provided in the alignment unit 120 which is a part of the laser processing unit 100, but may be provided in the alignment unit 60 which is provided separately from the laser processing unit 100 or may be provided in the both units. To improve throughput, the reflectivity R of the alignment unit 60 may be measured while detecting the center position of the substrate 10 and the crystal orientation of the substrate 10.

As described above, the alignment unit 60 includes the substrate holder configured to hold the substrate 10 from below, the imaging unit configured to image the substrate 10 held on the substrate holder and the moving unit configured to move an imaging position of the substrate 10 by the imaging unit. The substrate holder, the imaging unit and the moving unit provided in the alignment unit 60 are configured the same as the substrate holder 110, the imaging unit 121 and the substrate moving unit 140 provided in the laser processing unit 100, respectively, and, thus, illustration thereof will be omitted.

Figure 16:
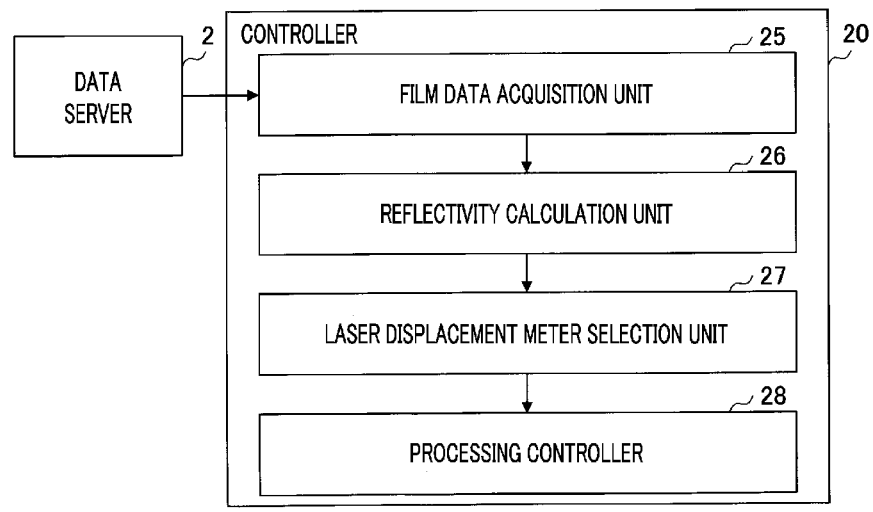
FIG. 16 illustrates components of a controller as functional blocks according to a third exemplary embodiment.

FIG. 16 illustrates components of a controller as functional blocks according to a third exemplary embodiment. The respective functional blocks illustrated in FIG. 16 are conceptual and do not necessarily have to be physically configured as illustrated. All or some of the functional blocks may be functionally or physically distributed and integrated in any unit. All or some of respective processing functions performed in the respective functional blocks may be realized by a program executed in the CPU, or may be realized as hardware by wired logic. Hereinafter, descriptions will be made focusing on a difference between the present exemplary embodiment and the first exemplary embodiment.

As illustrated in FIG. 16, the controller 20 is connected to a data server 2 via a network such as a local area network (LAN) or Internet connection. The connection may be any one of wired connection and wireless connection. The data server 2 is provided in a factory equipped with the substrate processing system 1 and transmits various kinds of data to the substrate processing system 1. For example, the data server 2 stores identification information of the substrate 10 corresponding to data (hereinafter, simply referred to as "film data") about the material and the film thickness of the film 18, which forms the upper surface (for example, the second main surface 12) of the substrate 10.

The film thickness of the film 18 is measured at least for each of the dividing target lines 13 and the measurement value is stored in the data server 2. The film thickness of the film 18 can be changed continuously for each of the dividing target lines 13. For this reason, the film thickness of the film 18 corresponding to the position in the surface of the substrate 10 is stored in the data server 2. Also, if the film 18 has the multilayer structure, a layer thickness of each layer in the film 18 corresponding to the position in the surface of the substrate 10 is stored in the data server 2.

The controller 20 includes a film data acquisition unit 25, a reflectivity calculation unit 26, a laser displacement meter selection unit 27 and a processing controller 28. The film data acquisition unit 25 is configured to acquire film data of the substrate 10 from the data server 2. The reflectivity calculation unit 26 is configured to calculate the reflectivity R of the first measurement laser beam LB2 reflected from the upper surface of the substrate 10 based on the film data acquired from the film data acquisition unit 25. The reflectivity R is calculated using, for example, the map illustrated in FIG. 10. The laser displacement meter selection unit 27 is configured to select the laser displacement meter for controlling the vertical direction position of the light condensing unit 152 at the time of processing the substrate from between the coaxial laser displacement meter 161 and the separate-axis laser displacement meter 181 based on the reflectivity R calculated by the reflectivity calculation unit 26. The processing controller 28 uses the laser displacement meter selected by the laser displacement meter selection unit 27 to measure the vertical direction position of the processing irradiation point P1 while moving the processing irradiation point P1 on the dividing target line 13 of the substrate 10 and controls the vertical direction position of the light condensing unit 152 based on the measurement result thereof.

Figure 17:
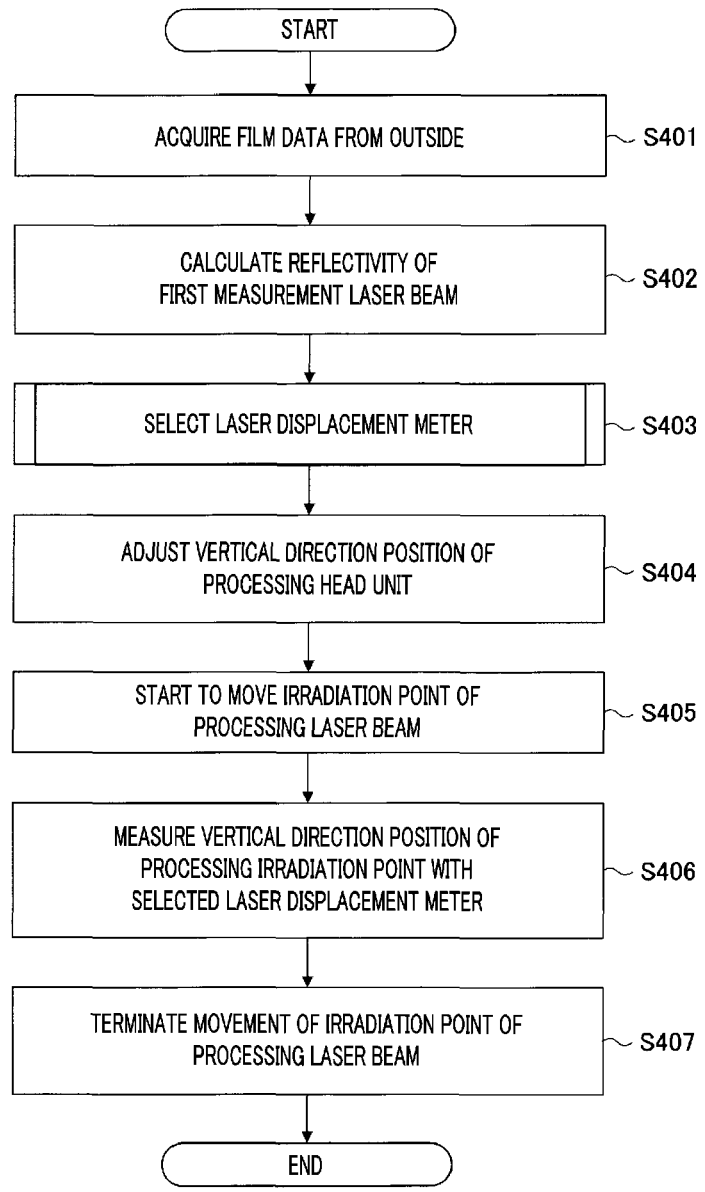
FIG. 17 is a flowchart showing a processing of the controller according to the third exemplary embodiment.

FIG. 17 is a flowchart showing a processing of the controller according to the third exemplary embodiment. The processing shown in FIG. 17 is performed in a case where the film thickness of the film 18 (further, the reflectivity) is uniform in the surface of the single substrate 10. Also, the processing shown in FIG. 17 can be performed in a case where the film thickness of the film 18 is uniform in the entire surface of the single substrate 10 and not uniform between the substrates 10. The processing after a process S401 shown in FIG. 17 is started, for example, when the transfer unit 58 places the substrate 10 on the substrate holder 110. To improve the throughput, the processing in the processes S401 to S403 may be performed along with the alignment processing for detecting the dividing target lines 13 of the substrate 10 by the alignment unit 120.

First, the film data acquisition unit 25 acquires the identification information (for example, letters, numbers, symbols, figures, etc.) marked on the substrate 10 held on the substrate holder 110 by using the imaging unit 121 and acquires the film data corresponding to the acquired identification information from the data server 2 (process S401). Herein, the figures representing the identification information may include, for example, a one-dimensional code and a two-dimensional code.

Then, the reflectivity calculation unit 26 calculates the reflectivity R of the first measurement laser beam LB2 reflected from the upper surface of the substrate 10 based on the film data acquired from the film data acquisition unit 25 (process S402). The reflectivity R is calculated using, for example, the map illustrated in FIG. 10. The reflectivity R is stored corresponding to the position of the processing irradiation point P1 on the dividing target line 13.

Then, the laser displacement meter selection unit 27 selects the laser displacement meter for controlling the vertical direction position of the light condensing unit 152 at the time of processing the substrate from between the coaxial laser displacement meter 161 and the separate-axis laser displacement meter 181 based on the reflectivity R calculated by the reflectivity calculation unit 26 (process S403). This selection is performed for each of the dividing target lines 13. This selection is performed the same as the selection shown in FIG. 15, and, thus, description thereof will be omitted.

Then, the processing controller 28 adjusts the vertical direction position of the processing head unit 130 (process S404). Thus, as illustrated in FIG. 6, the housing 131 of the processing head unit 130 is placed at the predetermined height from the substrate holder 110.

Then, the processing controller 28 starts to move the processing irradiation point P1 (process S405). Specifically, the controller 20 starts to move the processing irradiation point P1 toward the processing end point EP from the processing start point SP shown in FIG. 7. The controller 20 starts to form the processing trace. As the laser displacement meter used for controlling the vertical direction position of the light condensing unit 152 during the formation of a first processing trace, the separate-axis laser displacement meter 181 may be selected in the process S403. In this case, the controller 20 controls the separate-axis laser displacement meter 181 to measure the vertical direction position of the processing irradiation point P1 before the formation of the first processing trace, for example, from the time period ΔX/V before the formation of the first processing trace.

Then, the controller 20 controls the laser displacement meter selected in the process S403 to measure the vertical direction position of the processing irradiation point P1 and controls the vertical direction position of the light condensing unit 152 based on the measurement result thereof (process S406). The controller 20 controls the vertical direction position the light condensing unit 152 by using only any one of the coaxial laser displacement meter 161 or the separate-axis laser displacement meter 181 for each dividing target line 13.

Then, when the processing irradiation point P1 reaches the processing end point EP, the controller 20 terminates the movement of the processing irradiation point P1 (process S407) and ends the processing. Thus, the processing traces extended in the X-axis direction are formed at the interval along the Y-axis direction.

Thereafter, the controller 20 rotates the substrate holder 110 by 90° in the θ direction and then again forms processing traces extended in the X-axis direction at an interval along the Y-axis direction. Meanwhile, the laser displacement meter selected in the process S403 is used as the laser displacement meter for controlling the vertical direction position of the light condensing unit 152. Thus, the processing traces can be formed along the dividing target lines 13 formed in the lattice shape on the substrate 10.

According to the present exemplary embodiment, before the substrate is processed, any appropriate one of the coaxial laser displacement meter 161 or the separate-axis laser displacement meter 181 may be selected as the laser displacement meter for controlling the vertical direction position of the light condensing unit 152 at the time of processing the substrate. Therefore, for example, if the film thickness of the film 18 (further, the reflectivity R) is uniform in the entire surface of the single substrate 10, the coaxial laser displacement meter 161 can be selected from a first dividing target line 13, and, thus, it is possible to further reduce the processing time of the substrate 10. Further, if the film thickness of the film 18 (further, the reflectivity R) is not uniform in the surface of the single substrate 10, the laser displacement meter suitable for each dividing target line 13 can be selected, and, thus, it is possible to securely measure the vertical direction position of the processing irradiation point P1.

If the film thickness of the film 18 (further, the reflectivity R) is not uniform in the surface of the single substrate 10, the controller 20 switches the laser displacement meter for controlling the vertical direction position of the light condensing unit 152 while the single substrate 10 is processed with the processing laser beam LB1. This switchover is performed based on the reflectivity R calculated by the reflectivity calculation unit 26. Either or both of the switchover from the coaxial laser displacement meter 161 to the separate-axis laser displacement meter 181 and the switchover from the separate-axis laser displacement meter 181 to the coaxial laser displacement meter 161 may be performed. Further, the switchover just needs to be performed once or more. Different laser displacement meters are used, respectively, when one dividing target line 13 is processed and when another dividing target line 13 is processed. The switchover of the laser displacement meter makes it possible to securely measure the vertical direction position of the processing irradiation point P1 and to reduce the processing time of the single substrate 10.

If the film thickness of the film 18 (further, the reflectivity R) is uniform in the entire surface of the single substrate 10 and not uniform between the substrates 10, the controller 20 switches the laser displacement meter for controlling the vertical direction position of the light condensing unit 152 while the substrates 10 are processed with the processing laser beam LB1. This switchover is performed based on the reflectivity R calculated by the reflectivity calculation unit 26. Either or both of the switchover from the coaxial laser displacement meter 161 to the separate-axis laser displacement meter 181 and the switchover from the separate-axis laser displacement meter 181 to the coaxial laser displacement meter 161 may be performed. Further, the switchover just needs to be performed once or more. The switchover of the laser displacement meter is not performed while the single substrate 10 is processed. Different laser displacement meters are used, respectively, when one substrate 10 is processed and when another substrate 10 is processed. The switchover of the laser displacement meter makes it possible to securely measure the vertical direction position of the processing irradiation point P1 and to reduce the processing time of the substrates 10.

Although the exemplary embodiments of the laser processing device, the laser processing system and the laser processing method have been described above, the present disclosure is not limited to the above-described exemplary embodiments. Various changes, modifications, substitutions, additions, deletions and combinations may be made within the scope of the claims. Of course, such changes, modifications, substitutions, additions, deletions and combinations belong to the technical scope of the present disclosure.

For example, the controller 20 may combine two or more of the processing shown in FIG. 12, the processing shown in FIG. 14 and the processing shown in FIG. 17 to select the laser displacement meter for controlling the vertical direction position of the light condensing unit 152. The combination is not particularly limited.

The present application is based on and claims priority to Japanese Patent Application No. 2018-074994 filed to the Japan Patent Office on Apr. 9, 2018, the entire contents of which are hereby incorporated herein by reference.

EXPLANATION OF CODES

According to an aspect of the present disclosure, it is possible to measure a vertical direction position of an irradiation point of a processing laser beam on an upper surface of a substrate when the reflectivity of a measurement laser beam reflected from the upper surface of the substrate is not uniform.

We claim:

1. A laser processing device, comprising:
a substrate holder configured to horizontally hold a substrate from below;
a processing laser oscillator configured to oscillate a processing laser beam for processing the substrate;
a slider configured to move the substrate holder horizontally and move a processing irradiation point of the processing laser beam on an upper surface of the substrate held on the substrate holder;
a height measurement unit configured to measure a vertical direction position of the processing irradiation point;
a condensing lens configured to condense the processing laser beam from above to below the processing irradiation point;
an actuator configured to vertically move moves the condensing lens; and
a controller configured to control a vertical direction position of the condensing lens based on the vertical direction position of the processing irradiation point while moving the processing irradiation point along multiple dividing target lines on the upper surface of the substrate,
wherein the height measurement unit includes:
a coaxial laser displacement meter configured to measure a vertical direction position of a first measurement irradiation point, which is overlapped with the processing irradiation point in a vertical direction, by radiating, to the upper surface of the substrate, a first measurement laser beam having a different wavelength from the processing laser beam and a path same as the processing laser beam from a dichroic mirror provided in a path of the processing laser beam to the upper surface of the substrate and by receiving a reflected light of the first measurement laser beam; and a separate-axis laser displacement meter configured to measure a vertical direction position of a second measurement irradiation point, which is distanced away from the processing irradiation point in a horizontal direction, by radiating, to the upper surface of the substrate, a second measurement laser beam having a different wavelength and a different path from the processing laser beam and the first measurement laser beam and by receiving a reflected light of the second measurement laser beam, and
wherein the controller selects either the coaxial laser displacement meter or the separate-axis laser displacement meter for each of the multiple dividing target lines before processing each dividing target line with the processing laser beam, and controls the vertical direction position of the condensing lens by using only one of selected meters while each of the multiple dividing target lines is processed with the processing laser beam,
wherein the separate-axis laser displacement meter obtains the vertical direction position of the processing irradiation point before a predetermined time period earlier than the coaxial laser displacement meter, and the controller controls the vertical direction position of the condensing lens based on a measurement result by the separate-axis laser displacement meter and monitors an intensity of the reflected light received by the coaxial laser displacement meter while a part of the multiple dividing target lines is processed, and
wherein when the monitored intensity of the reflected light is equal to or higher than a predetermined value, the controller performs a switchover of a laser displacement meter for controlling the vertical direction position of the condensing lens from the separate-axis laser displacement meter to the coaxial laser displacement meter, and controls a position of the condensing lens based on a measurement result by the coaxial laser displacement meter while a rest of the multiple dividing target lines is processed.

2. The laser processing device of claim 1,
wherein the controller acquires data about a material and a film thickness of a film which forms the upper surface of the substrate,
the controller calculates a reflectivity of the first measurement laser beam reflected from the upper surface of the substrate based on the acquired data, and
the controller controls a position of the condensing lens by the coaxial laser displacement meter when an intensity of the reflected light received by the coaxial laser displacement meter is equal to or higher than a predetermined value based on the calculated reflectivity of the first measurement laser beam.

3. The laser processing device of claim 1, further comprising:
a camera configured to detect the dividing target lines of the substrate held on the substrate holder; and
a laser light receiver configured to receive a reflected light of an inspection laser beam, having a same wavelength as the first measurement laser beam, reflected from the upper surface of the substrate and measure a reflectivity of the inspection laser beam, and
the controller controls a position of the condensing lens by the coaxial laser displacement meter when an intensity of the reflected light received by the coaxial laser displacement meter is equal to or higher than a predetermined value based on the reflectivity measured by the laser light receiver.

4. A laser processing system, comprising:
a laser processing device of claim 1;
an alignment device configured to measure a center position of the substrate and a crystal orientation of the substrate; and
a transfer device configured to transfer the substrate from the alignment device to the laser processing device,
wherein the alignment device includes a reflectivity measurement unit configured to measure a reflectivity of an inspection laser beam having a wavelength same as the first measurement laser beam from the upper surface of the substrate, and
the controller performs the switchover based on the reflectivity measured by the reflectivity measurement unit of the alignment device.

5. A laser processing method including measuring a vertical direction position of a processing irradiation point of a processing laser beam while moving the processing irradiation point along multiple dividing target lines on an upper surface of a substrate horizontally held; and controlling a vertical direction position of a condensing lens configured to condense the processing laser beam from above to below the processing irradiation point based on a measurement result by the measuring of the vertical direction position of the processing irradiation point, the laser processing method comprising:
selecting either a coaxial laser displacement meter or a separate-axis laser displacement meter for each of the multiple dividing target lines before processing each dividing target line with the processing laser beam, and controlling the vertical direction position of the condensing lens by using only one of selected meters while each of the multiple dividing target lines is processed with the processing laser beam, wherein the coaxial laser displacement meter is configured to measure a vertical direction position of a first measurement irradiation point, which is overlapped with the processing irradiation point in a vertical direction, by radiating, to the upper surface of the substrate, a first measurement laser beam having a different wavelength from the processing laser beam and a path same as the processing laser beam from a dichroic mirror provided in a path of the processing laser beam to the upper surface of the substrate and receiving a reflected light of the first measurement laser beam; and the separate-axis laser displacement meter is configured to measure a vertical direction position of a second measurement irradiation point, which is distanced away from the processing irradiation point in a horizontal direction, by radiating, to the upper surface of the substrate, a second measurement laser beam having a different wavelength and a different path from the processing laser beam and the first measurement laser beam and receiving a reflected light of the second measurement laser beam,
wherein the separate-axis laser displacement meter obtains the vertical direction position of the processing irradiation point before a predetermined time period earlier than the coaxial laser displacement meter, the vertical direction position of the condensing lens based on a measurement result is controlled by the separate-axis laser displacement meter and an intensity of the reflected light received by the coaxial laser displacement meter is monitored while a part of the multiple dividing target lines is processed, and
when the monitored intensity of the reflected light is equal to or higher than a predetermined value, a switchover of a laser displacement meter is performed for controlling the vertical direction position of the condensing lens from the separate-axis laser displacement meter to the coaxial laser displacement meter, and a positioning of the condensing lens is performed based on a measurement result by the coaxial laser displacement meter while a rest of the multiple dividing target lines is processed.

6. The laser processing method of claim 5, further comprising:
acquiring, before processing the substrate, data about a material and a film thickness of a film, which forms the upper surface of the substrate;
calculating a reflectivity of the first measurement laser beam reflected from the upper surface of the substrate based on the acquired data; and
controlling a position of the condensing lens by the coaxial laser displacement meter when an intensity of the reflected light received by the coaxial laser displacement meter is equal to or higher than a predetermined value based on the calculated reflectivity of the first measurement laser beam.

7. The laser processing method of claim 5, further comprising:
measuring, before processing the substrate, a reflectivity of an inspection laser beam having a wavelength same as the first measurement laser beam from the upper surface of the substrate; and
controlling a position of the condensing lens by the coaxial laser displacement meter when an intensity of the reflected light received by the coaxial laser displacement meter is equal to or higher than a predetermined value based on the measured reflectivity of the inspection laser beam.

* * * * *